United States Patent [19]

Odake et al.

[11] Patent Number: 5,359,554
[45] Date of Patent: Oct. 25, 1994

[54] SEMICONDUCTOR MEMORY DEVICE HAVING AN ENERGY GAP FOR HIGH SPEED OPERATION

[75] Inventors: Yoshinori Odake; Yasushi Okuda, both of Osaka, Japan

[73] Assignee: Matsushita Electric Industrial Co., Ltd., Osaka, Japan

[21] Appl. No.: 906,671

[22] Filed: Jun. 30, 1992

[30] Foreign Application Priority Data

Aug. 27, 1991 [JP] Japan .................. 3-215104
Feb. 20, 1992 [JP] Japan .................... 4-33493

[51] Int. Cl.$^5$ .......................................... H01L 27/10
[52] U.S. Cl. ......................... 365/184; 365/218; 365/182; 365/185; 257/314; 257/322
[58] Field of Search ............ 365/184, 218, 182, 185; 257/314, 322, 321

[56] References Cited

U.S. PATENT DOCUMENTS

| 4,360,900 | 11/1982 | Bate | 365/182 |
| 4,627,029 | 12/1986 | Wilson et al. | 365/107 |
| 5,162,880 | 11/1992 | Hazama et al. | 257/106 |

FOREIGN PATENT DOCUMENTS

| 2-106068 | 4/1990 | Japan . |
| 3-112167 | 5/1991 | Japan . |
| 3-166768 | 7/1991 | Japan . |

OTHER PUBLICATIONS

H. Kume et al., "A 3.42 $\mu m^2$ Flash Memory Cell Technology Conformable to a Sector Erase", ULSI Symp. (1991).

*Primary Examiner*—Viet Q. Nguyen
*Attorney, Agent, or Firm*—Willian Brinks Hofer Gilson & Lione

[57] ABSTRACT

A semiconductor device is provided comprising a nonvolatile memory cell through which an LSI and a higher operating speed are achieved. A drain region, an insulating layer partly overlaying the drain region, and a gate electrode formed on the insulating layer are formed on a semiconductor substrate thereby making up a memory cell without a source region. An energy gap between the conduction and valence bands of a semiconductor section including the drain region and the semiconductor substrate is preset to a value corresponding to a first set voltage difference between the drain and the gate. The energy gap between the valence bands (or the conduction bands) of the insulating layer and the semiconductor section at the interface between the semiconductor section and the insulating layer is preset to a value corresponding to a second set voltage difference between the drain and the substrate. Write operations are done by trapping in the insulating layer a charge which has jumped the valence band of the insulating layer at a voltage not less than the second set voltage difference. Read operations are done at a voltage not less than the first set voltage but not more than the second set voltage. Erase operations are done by releasing a charge trapped or by implanting a reverse charge.

17 Claims, 33 Drawing Sheets gate electrode | SiO₂ | Si substrate

Si substrate ——|—— drain region gate electrode : SiO₂ : Si substrate

Si substrate ⟶ ⟵ drain region

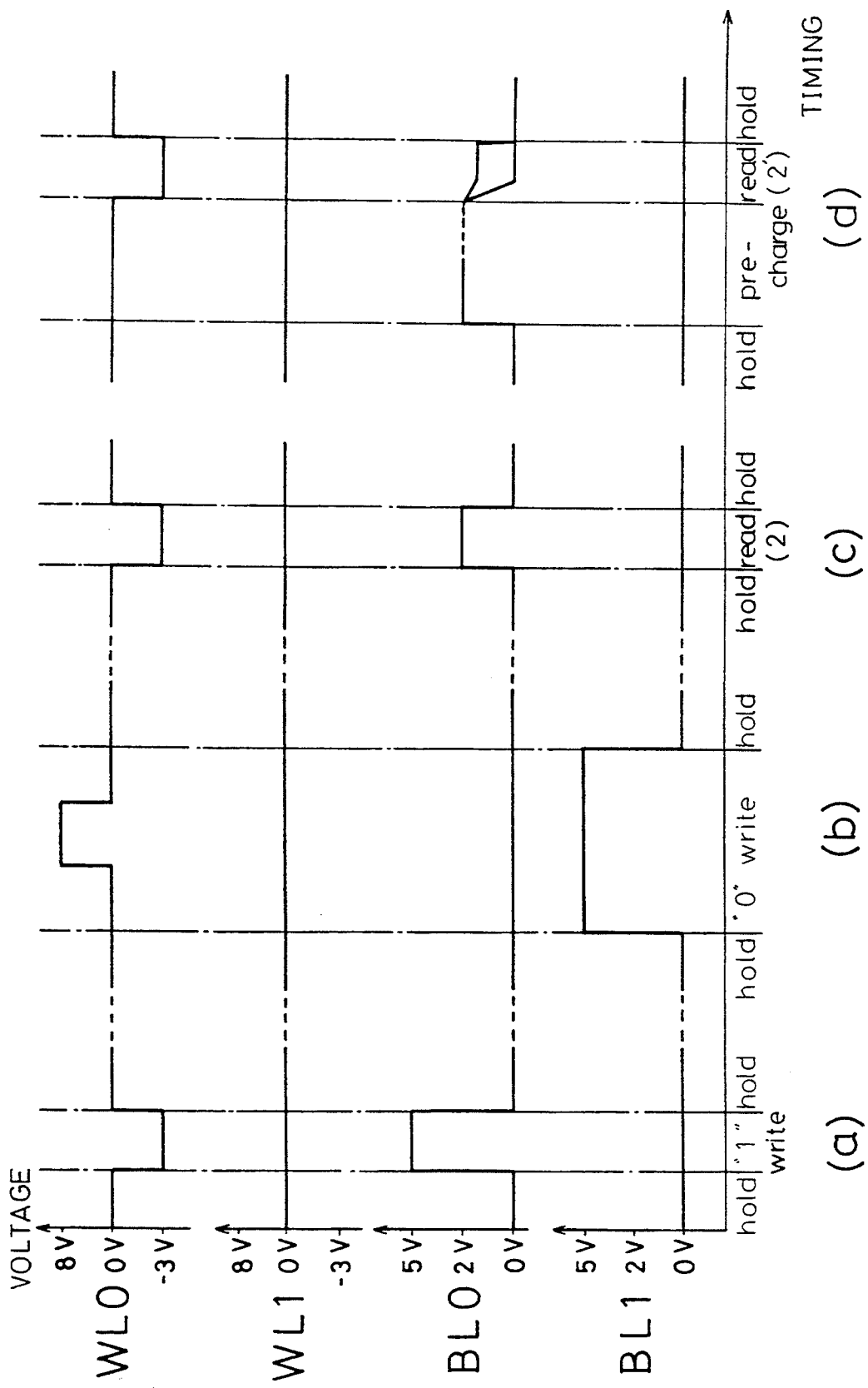

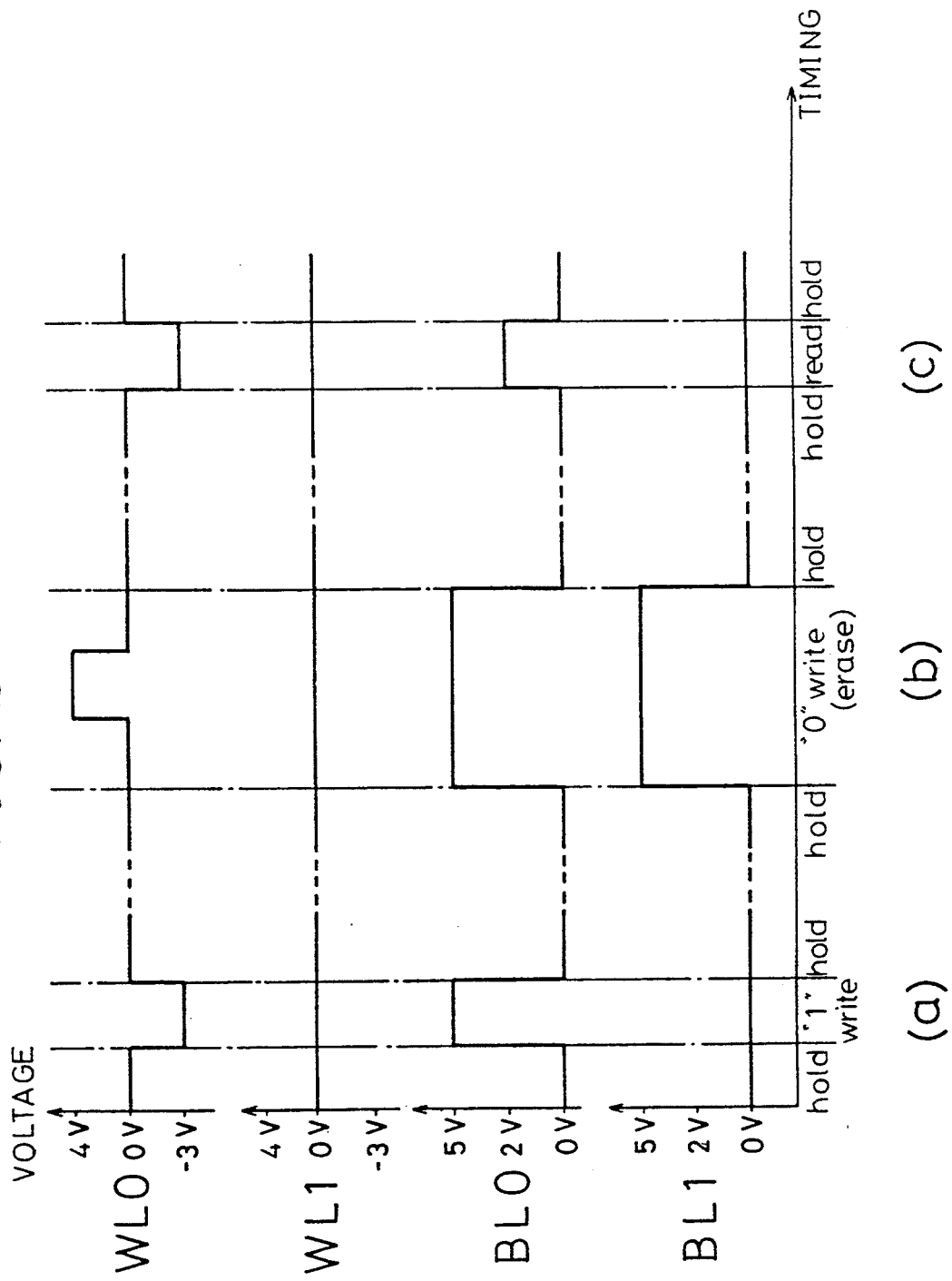

SEMICONDUCTOR MEMORY DEVICE HAVING AN ENERGY GAP FOR HIGH SPEED OPERATION

BACKGROUND OF THE INVENTION

This invention relates to MIS-type semiconductor memory devices. More particularly, it pertains to VLSI, very large scale integration.

Flash-type EEPROMs (electrically erasable programmable ROMs) have been known as a VLSI semiconductor memory circuit (VLSI Symp. pp., 1991 by H. Kume et al). With reference to FIG. 30 (a and b), a conventional semiconductor memory circuit will be illustrated. FIG. 30a is a cross-sectional view of a conventional semiconductor memory device structure. Formed on a p-type semiconductor substrate a is a first $SiO_2$ layer b1 (i.e., an oxide insulating layer) over which lie a floating gate formed of a Si polycrystalline layer, a second $SiO_2$ layer b2 and a control gate electrode c formed of a Si polycrystalline layer. On the surface region of the semiconductor substrate a, a drain region e is formed at one edge of the first $SiO_2$ layer b1 and a source region f, at the other edge. Furthermore, a metal layer g of an aluminum, which forms a bit line via an interlayer dielectric h, is formed.

A flash-type EEPROM, as described above, incorporates therein no capacitors, so that it compares favorably with a DRAM (dynamic RAM) in that it has positive possibilities of accomplishing a VLSI. FIG. 30b shows an example of a circuit wiring structure of a conventional EEPROM. Bit lines D0 and D1 are tied to respective drains e of each of memory cells A, B, C and D. Connected to respective control gate electrodes c of each of the memory cells are word lines W0 and W1. And a source line S is tied to a source f of each memory cell. As is depicted in FIG. 30b, a flash-type EEPROM employs a simpler circuit structure than a DRAM. The following table shows individual voltages of the W0, W1, S, D0 and D1 when executing ERASE, "1" WRITE or READ operation for the memory cell A.

TABLE 1

|  | W0 | W1 | S | D0 | D1 |
|---|---|---|---|---|---|
| ERASE | −9 | 5 | 5 | FLOATING | FLOATING |
| WRITE | 10 | 0 | 0 | 4 | 0 |
| READ | 5 | 0 | 0 | 1 | 0 |

For a conventional flash-type EEPROM to achieve a large scale integration as well as a high-speed operation, two erase methods have been used, which are a sector erase method of deleting a plurality of memory cells as a single unit and a block unit batch erase method.

Japanese Patent Publication No. 3-166768 discloses a drain region i of a first conductivity type (p-type) and a source region J of a second conductivity type (n-type) which are selectively formed on a semiconductor substrate of a first conductivity type (p-type) (see FIG. 31). An insulating layer k which is thick enough to cause tunneling is formed in a manner such that it extends from the drain region 1 to the source region j. Formed on the insulating layer k are an information storage layer 1 which traps therein an electric charge, and a gate electrode m. When a write operation is executed, a given high voltage is placed to the gate electrode m to cause band-to-band tunneling in a surface portion 11 of the drain region 1 positioned just under the gate electrode m. An electron, generated by this tunneling phenomenon, passes through the insulating layer k so that it will be trapped in the information storage layer 1. In this way, nonvolatile information is stored. On the other hand, in some prior art techniques, the information thus stored is read out of the information storage layer 1 by applying a given read voltage to the gate electrode m to detect whether an ON state occurs due to the generation of band-to-band tunneling in the surface portion i1 of the drain region i positioned just under the gate electrode m. In other words, by getting rid of channel effect, such techniques intend to shorten the length of a channel to achieve a large scale integration and a high speed read operation.

Additionally, Japanese Patent Publication No. 2-106068 discloses a technique. As shown in FIG. 33a, a source region p and a drain region q, each of which is of a second conductivity type, are formed on a semiconductor substrate o of a first conductivity type. Extending from one edge of the source region p to one edge of the drain region q is a $SiO_2$ layer r over which lies a gate electrode t. An ion implantation region s is formed at one side of the $SiO_2$ layer r facing the semiconductor substrate o by mean of the Si (or the group IV elements such as Ge) ion implantation method using accelerating energy of about 15 keV. In this prior art, the implantation and emission of charges to and from the ion implantation region s is controlled so that the ion implantation region s is given a nonvolatile memory function. That is, this prior art uses hysteresis phenomenons, as shown in FIG. 33b in which the abscissa indicates a gate to source voltage Vgs while the ordinate indicates a drain current Id. With a drain to source voltage Vds and a substrate bias Vsub set to 0.1 V and 0 V respectively, there is a threshold voltage difference between "when sweeping the gate to source voltage Vgs from −5 to 5 V (which is indicated by curve C0)" and "when sweeping the same the other way round, that is, from 5 to −5 (which is indicated by curve C1)".

However, the word line in the foregoing flash-type EEPROM requires a negative voltage, −9 V which is above TTL levels. Furthermore, four values, namely voltages 0 V, 5 V, 10 V including a negative voltage, are required, as shown in Table 1. In addition thereto, the bit line also requires four values, namely voltages 0 V, 1 V, 4 V including a floating voltage. These are obstacles not only to the realization of a high speed operation, but also to the realization of a large scale integration, since related peripheral circuits including a power circuit inevitably become large. In addition, since a source line requires two values, 0 V and 5 V, this also causes additional difficulties in achieving a high speed operation and a large scale integration.

Of all of the conventional technologies, DRAMs have been known as a largest scale integrated semiconductor memory circuit, which are capable of executing a READ or WRITE operation per bit. In DRAMs, however, a read operation is done in a destructive manner, resulting in destroying the data stored in every memory cell sharing a common word line with a certain memory cell that has been selected in carrying out a READ or WRITE operation. This necessitates such an arrangement that a sense amplifier must be connected to each bit line in order that the data destroyed is rewritten to all of the memory cells sharing a common word line with the selected memory cell while READ or WRITE operation is being executed. Further, as data holding time is very short (about one second), DRAMs require refresh operations. Such also causes problems such as a very slow speed operation and the increase of power consumption.

SRAMs (static RAM) have been recognized as a semiconductor memory circuit with a shortest access time, which are capable of executing both READ and WRITE operations per bit. In SRAMs, a READ operation is done in a non-destructive manner, and no refresh operations are required unlike DRAMs. A 1-bit memory cell of the SRAM, however, is composed of four or more MOS transistors. In addition, since two bit lines are connected to a single memory cell, this causes difficulties in achieving a large scale integration. Generally, the degree of integration of SRAMs is a quarter of that of DRAMs, and the memory cell of SRAMs requires power supply even in a data holding state. This inevitably leads to the increase of power consumption.

The former Japanese Patent Publication is able to store information in a nonvolatile state and adopts a memory cell provided with one transistor. Because of such features, this prior art may have some advantages to realize a larger scale integration over DRAMs and SRAMs.

In the above prior art, the drain region i and source region j have a different conductivity type. Because of this, a source region leakage current (indicated by solid line) and a drain region leakage current (indicated by broken line) are generated, as shown in FIG. 32. To prevent these unwanted currents occurring, it is necessary to form, for example, a deep insulating layer or the like, which however is not deemed practical.

For the invention of the latter Japanese Patent Publication, the drain region q and the source region p have the same conductivity type, so that the foregoing unfavorable leakage currents may be easily avoided. Instead, punch-through, however, occurs when the length of a gate is shortened due to short channel effect, which causes difficulties in improving the degree of integration.

SUMMARY OF THE INVENTION

The present invention provides a semiconductor memory device which achieves not only a large scale integration but also a high speed operation, which is made feasible by the fact that an insulating layer between a drain and a gate is given a function of storing information in a nonvolatile manner.

A first embodiment of the present invention shows a semiconductor memory device. A 1-bit memory cell of the semiconductor memory device of the embodiment is a 3-terminal structure made up of a semiconductor substrate, a drain and a gate, which is characterized in that it excludes a source region. In the memory cell, an insulating layer between the drain and the gate is so formed that it can hold charges in a nonvolatile manner by means of band-state controlling. And by using hysteresis effect that the value of a gate induced drain leakage current varies depending on whether the insulating layer holds charges therein, the semiconductor memory device of the invention executes a WRITE, READ or ERASE operation according to the applied voltages to the individual terminals.

More specifically, the first embodiment provides a first solving means, wherein the semiconductor memory device has such a structure as shown in FIG. 1. Provided on a semiconductor substrate of a first conductivity type is a memory cell. The memory cell is composed of a drain region of a second conductivity type which is formed selectively on a surface location of the semiconductor substrate, an insulating layer which is formed on the semiconductor substrate in a manner such that it overlies at least partly an edge of the drain region, and a gate electrode which is formed on the insulating layer. In the memory cell, the energy gap between the conduction band and the valence band of a semiconductor section (which includes the drain region and the semiconductor substrate) is preset to a value not more than a gap value corresponding to a first set voltage difference between the drain region and the gate electrode, while either the energy gap between the valence band of the insulating layer and the valence band of the semiconductor section or the energy gap between the conduction band of the insulating layer and the conduction band of the semiconductor section, at the interface between the semiconductor section and the insulating layer, is preset to a gap value corresponding to a second set voltage difference, which varies according to the gate electrode voltages, between the drain region and the semiconductor substrate, so that the insulating layer comes to hold therein charges and is able to store information in a nonvolatile manner.

The above memory cell of the semiconductor memory device is so formed that a charge, which has jumped the valence band (or the conduction band) of the insulating layer, is trapped in the insulating layer in a nonvolatile manner. Thus, a state that a charge is trapped in the insulating layer and another that no charge is trapped in the insulating layer can be stored as a "1" and a "0" respectively. Additionally, the 1-bit memory cell is a 3-terminal structure made up of the semiconductor substrate, the gate electrode and the drain region. Also, this memory cell is a memory cell with one transistor and requires no drain regions. Accordingly, a channel between a source and a drain is no longer required. Furthermore, since there is provided only a drain region, unfavorable problems such as current interference between drain and source regions can be avoided. This advantage contributes to achieving a much larger scale integration of semiconductor memory devices.

The first embodiment provides a second solving means in accordance with the first solving means, wherein the insulating layer of at least one memory cell is previously shifted to and kept at the state of "1" as a result of pretrapping of charges, and read means is provided which applies between the drain region and the gate electrode a voltage not less than the first set voltage difference while it applies between the drain region and the semiconductor substrate a voltage lower than the second set voltage difference, so that the stored information is read out by sensing the value of a gate induced drain leakage current.

In this solving means, when a voltage not less than the first set voltage difference is applied between the drain region and the gate electrode by the read means, the bands of the semiconductor section curve beyond the energy gap between the conduction and valence bands. This causes a gate induced drain leakage current resulting from band-to-band tunneling. At this point, the value of such a gate induced drain leakage current varies depending on whether the insulating layer holds therein charges. In other words, when the insulating layer holds a charge (i.e., is in a "1"), the electric filed relaxes because of the presence of the charges trapped. Therefore, the current value at the state of "1" is lower than that of the state of "0" in which the insulating layer holds no charges. Accordingly, from the difference in current value, information stored in the insulating layer can be read out as either a "1" or a "0". Further, no charges will jump the valence band (or the conduction band) of the insulating layer and enter the insulating layer, since the voltage between the drain region and the gate electrode voltage is lower than the second set voltage difference. In other words, the information stored in the insulating layer is retained undamaged (i.e., is read out in a non-destructive manner). Accordingly, the present semiconductor memory device may function as a ROM if each memory cell is pre-set to a "0" or "1" state in accordance with, for example, a fixed pattern.

The first invention provides a third solving means in accordance with the first solving means, wherein write means is provided in the semiconductor memory device. The write means applies between the drain region and the gate electrode a voltage not less than the first set voltage difference while it applies between the drain region and the semiconductor substrate a voltage not less than the second setting voltage difference. As a result, a gate induced drain leakage current occurs, and charges are trapped in the insulating layer. Accordingly, the insulating layer is written into the state of "1".

In this solving means, when a voltage not less than the first set voltage difference is applied between the drain region and the gate electrode by the read means, the bands of the semiconductor section curve beyond the energy gap between the conduction and valence bands. This causes a gate induced drain leakage current resulting from band-to-band tunneling. Further, when a voltage not less than the second setting voltage is applied between the drain region and the semiconductor substrate, the bands of the semiconductor section curve beyond the energy gap between the valence band of the insulating layer and the valence band of the semiconductor section (or the energy gap between the conduction band of the insulating layer and the conduction band of the semiconductor section), at the interface between the gate electrode and the semiconductor section. As a result, charges jump the valence band (or the conduction band) of the insulating layer and are trapped in the insulating layer, thereby the insulating layer being kept at the state of "1". The charges trapped and held in the insulating layer are retained in a nonvolatile state until the application of a reverse voltage or the implantation of a reverse polarity charge is applied to the insulating layer. A nonvolatile "1" state can be stored in the insulating layer. Accordingly, the insulating layer can be used as a PROM material by recording specified information into the semiconductor memory device.

The first embodiment provides a fourth solving means in accordance with the third solving means, wherein read means is provided in the semiconductor memory device. The read means applies between the drain region and the gate electrode a voltage not less than the first setting voltage difference while it applies between the drain region and the semiconductor substrate a voltage lower than the second setting voltage difference so that information stored is read out by sensing the value of a gate induced drain leakage current.

In this solving means, information pre-stored in or pre-written into a storage location (i.e., the insulating layer) by the write means is non-destructively read out by the read means. Thus, the semiconductor memory device can serve also as a PROM.

The first embodiment provides a fifth solving mean in accordance with the first solving means, wherein the insulating layer of at least one memory cell in the semiconductor memory device is previously shifted to and kept at in the state of "1" as a result of pre-trapping of charges, and erase means is provided which applies between the gate electrode and the semiconductor section a given voltage to release the charges trapped from the insulating layer. As a result, the insulating layer transfers to the state of "0".

In this solving means, if a voltage not less than the given voltage is applied by the erase means between the gate electrode and the semiconductor section, with the memory cell in the state of "1", the trapped charges transfer from the insulating layer to the semiconductor section. In other words, the charges held in the insulating layer disappear, and the contents of a memory stored information in the insulating layer is changed to the state of "0". Therefore, it is possible to rewrite the information that has already been written to the semiconductor memory device.

The first embodiment provides a sixth solving means in accordance with the fourth embodiment, wherein erase means is provided in the semiconductor memory device. The erase means applies between the gate electrode and the semiconductor section of the memory cell which holds charges and therefore is in the state of "1" a given voltage to release the charges trapped from the insulating layer. As a result, the insulating layer transfers to the state of "0".

In this solving means, if such a given voltage is applied by the erase means between the gate electrode and the semiconductor section, with the memory cell in the state of "1", the same operation as the above fifth solving means is obtained. Therefore, the semiconductor memory device can serve also as an EEPROM capable of executing WRITE, READ or ERASE operation or as a nonvolatile RAM.

The first embodiment provides a seventh solving means in accordance with the first solving means, wherein the insulating layer of at least one memory cell is previously shifted to and kept at the state of "1" as a result of pretrapping of charges, and erase means is provided which imposes between both faces of the insulating layer which is in the state of "1" a high electric field to cause Fowler-Nordheim (FN) current so that resulting reverse polarity charges are implanted into the insulating layer. As a result, the insulating layer transfers to the state of "0".

In this solving means, if a high electric field is imposed by the erase means between both faces of the insulating layer with the insulating layer of the memory cell in the state of "1", an FN current occurs thereby causing reverse polarity charges to flow into the insulating layer. As a result, such reverse polarity charges recombine with the charges held in the insulating layer. The charges held in the insulating layer disappear, and the contents of a memory stored in the insulating layer transfers to the state of "0". Accordingly, it is possible to rewrite the contents of a memory stored in the semiconductor memory device.

The first embodiment provides an eighth solving means in accordance with the fourth solving means, wherein erase means is provided in the semiconductor memory device. The erase means imposes between both faces of the insulating layer which is in the state of "1" a high electric field to cause Fowler-Nordheim current so that resulting reverse polarity charges are implanted into the insulating layer. As a result, the insulating layer transfers to the state of "0".

In this solving means, if a high electric field is imposed by the erase means between both faces of the insulating layer, with the insulating layer of the memory cell in the state of "1", the same operation as the above seventh solving means is obtained. Therefore, the semiconductor memory device can serve also as an EEPROM capable of electrically executing WRITE, READ or ERASE operation or as a nonvolatile RAM.

The first embodiment provides a ninth solving means in accordance with the first solving means, wherein the insulating layer of each memory cell is previously shifted to and kept at the state of "1" as a result of pre-trapplng of charges.

In this solving means, each of the insulating layers has been held in the state of "1" in advance, and is then shifted to the state of "0" so that a "0" WRITE operation is executed. The contents of a memory can be erased by bringing the insulating layer into the state of "1" again. The value of a gate induced drain leakage current occurring when the insulating layer is in the state of "1" is lower than in the state of "0", when a READ operation is carried out to read the contents of a memory from the insulating layer. Accordingly, taking the fact that the number of memory cells actually to be used is generally not many into account, the write operation according to the this embodiment requires less power than a write operation which is executed by changing the insulating layer from a "0" to a "1".

The first embodiment provides a tenth solving means in accordance with the third embodiment. At least four memory cells are provided. At least two word lines are provided. At least two bit lines are provided. Each word line is connected to the gate electrodes of at least two of the memory cells. Each bit line, on the other hand, is connected to the drain regions of at least two of the memory cells. The write means is so structured that it can selectively write the contents of a memory, wherein four voltages (i.e., a selective word line voltage Vkcw, a non-selective word line voltage Vknw, a selective bit line voltage Vkcb and a non-selective bit line voltage Vknb) are set either according to Vkcw<Vknw and Vknb<Vkcb for a p-type substrate or according to Vkcw>Vknw and Vknb>Vkcb for an n-type substrate, the set voltages of the word lines comprise two values, and the set voltages of the bit lines comprise two values.

In this solving means, a selective WRITE operation can be executed by means of simple voltage setting, so that WRITE operation can be executed at a high speed. Additionally, the peripheral circuitry of power circuits is simplified so that a large scale integration can be accomplished. Furthermore, the semiconductor memory device can function as a PROM capable of executing a selective WRITE operation per bit.

The first embodiment provides an eleventh solving means in accordance with the second or fourth embodiment. At least four memory cells, at least two word lines and at least two bit lines are provided. Each word line is connected to the gate electrodes of at least two of the memory cells. Each bit line, on the other hand, is connected to the drain regions of at least two of the memory cells. The read means is so structured that it can selectively read the contents of a memory, wherein four voltages (i.e., a selective word line voltage Vycw, a non-selective word line voltage Vynw, a selective bit line voltage Vycb and a non-selective bit line voltage Vynb) are set either according to Vycw<Vynw and Vynb<Vycb for a p-type substrate or according to Vycw>Vynw and Vynb>Vycb for an n-type substrate, the set voltages of the word lines comprise two values and the set voltages of the bit lines comprise two values.

In this solving means, a selective READ operation can be executed by means of simple voltage setting, so that a high speed READ operation can be performed. Additionally, the peripheral circuitry of power circuits is simplified thereby achieving a large scale integration. Furthermore, the semiconductor memory device can function as a ROM or a PROM capable of executing a selective READ operation per bit.

A twelfth solving means in accordance with the fourth solving means is provided in the first embodiment. At least four memory cells are provided. At least two word lines are provided. At least two bit lines are provided. Each word line is connected to the gate electrodes of at least two of the memory cells, while each bit line, on the other hand, is connected to the drain regions of at least two of the memory cells. The write means and the read means are so structured that they can carry out a selective write operation and a selective read operation respectively, wherein eight voltages (i.e., a selective word line voltage Vkcw and a non-selective word line voltage Vknw for a write operation, a selective word line voltage Vycw and a non-elective word line voltage Vynw for a read operation, a selective bit line voltage Vkcb and a non-selective bit line voltage Vknb for a write operation, and a selective bit line voltage Vycb and a non-selective bit line voltage Vynb for a read operation) are set according to Vkcw=Vycw<Vknw=Vynw and Vknb=Vynb<Vycb<Vkcb for a p-type substrate or according to Vkcw=Vycw>Vknw=Vynw and Vknb=Vynb>Vycb>Vkcb for an n-type substrate, the set voltages of the word lines comprise two values and the set voltages of the bit lines comprise three values.

In this solving means, it is possible to realize a high speed operation and a large scale integration, accordingly. Furthermore, the semiconductor memory device can function as a PROM capable of executing selective WRITE or READ operation per bit.

A thirteenth solving means in accordance with the fourth solving means is provided in the first embodiment. At least four memory cells are provided. At least two word lines are provided. At least two bit lines are provided. Each word line is connected to the gate electrodes of at least two of the memory cells, and each bit line, on the other hand, is connected to the drain regions of at least two of the memory cells. The write means and the read means are so structured that they can execute a selective write operation and a read operation respectively, wherein eight voltages (i.e., a selective word line voltage Vkcw and a non-selective word line voltage Vknw for a write operation, a selective word line voltage Vycw and a non-elective word line voltage Vynw for a read operation, a selective bit line voltage Vkcb and a non-selective bit line voltage Vknb for a write operation, and a selective bit line voltage Vycb and a non-selective bit line voltage Vynb for a read operation) are set either according to Vkcw<Vknw=Vycw<Vynw and Vknb=Vynb<Vkcb=Vycb for a p-type substrate or according to Vkcw>Vknw=Vycw>Vynw and Vknb=Vynb>Vkcb=Vycb for an n-type substrate, the set voltages of the word lines comprise three values and the set voltages of the bit lines comprise two values.

A fourteenth solving means in accordance with the fifth or seventh solving means is provided in the first embodiment. At least four memory cells, at least two word lines and at least two bit lines are provided. Each word line are connected to the gate electrodes of at least two of the memory cells. Each bit line is connected to the drain regions of at least two of the memory cells. The erase means is so structured that it can selectively erase the contents of a memory, wherein four voltages (i.e., a selective word line voltage Vscw, a non-selective word line voltage Vsnw, a selective bit line voltage Vscb and a non-selective bit line voltage Vsnb) are set either according to Vscw>Vsnw and Vsnb>Vscb for a p-type substrate or according to Vscw<Vsnw and Vsnb<Vscb for an n-type substrate, the set voltages of the word lines comprise two values and the set voltages of the bit lines comprise two values.

In this solving means, a selective ERASE operation can be executed by means of simple voltage setting, so that a high speed ERASE operation can be achieved. Additionally, the peripheral circuitry of power circuits is simplified thereby achieving a large scale integration. Furthermore, the semiconductor memory device can function as a PROM capable of executing a selective ERASE operation per bit, that is, a selective RE-WRITE operation can be carried out.

A fifteenth solving means in accordance with the sixth or eighth solving means is provided in the first embodiment. At least four memory cells, at least two word lines and at least two bit lines are provided. Each word line is connected to the gate electrodes of at least two of the memory cells, while each bit line is connected to the drain regions of at least two of the memory cells. The write, read and erase means are so structured that they can carry out selective write, read and erase operations respectively, wherein twelve voltages (i.e., a selective word line voltage Vkcw and a non-selective word line voltage Vknw for a write operation, a selective word line voltage Vycw and a non-selective word line voltage Vynw for a read operation, a selective word line voltage Vscw and a non-selective word line voltage Vsnw for an erase operation, a selective bit line voltage Vkcb and a non-selective bit line voltage Vknb when executing a WRITE operation, a selective bit line voltage Vycb and a non-selective bit line voltage Vynb for a read operation, and a selective bit line voltage Vscb and a non-selective bit line voltage Vsnb for an erase operation) are set either according to Vkcw=Vycw<Vknw=Vynw=Vsnw<Vscw and Vknb=Vynb=Vscb<Vycb<Vkcb=Vsnb for a p-type substrate or according to Vkcw=Vycw>Vknw=Vynw=Vsnw>Vscw and Vknb=Vynb=Vscb>Vycb>Vkcb=Vsnb for an n-type substrate, the set voltages of the word lines comprise three values and the set voltages of the bit lines comprise three values.

In this solving means, it is possible to realize a high speed operation by means of simple voltage setting, accordingly. Additionally, the peripheral circuitry of power circuits can be simplified thereby achieving a large scale integration. Furthermore, the semiconductor memory device can function as an EEPROM capable of executing a selective WRITE, READ or ERASE operation per bit or as a nonvolatile RAM.

A sixteenth solving means in accordance with the sixth or eighth solving means is provided in the first embodiment. At least four memory cells, at least two word lines and at least two bit lines are provided. Each word line is connected to the gate electrodes of at least two of the memory cells, and each bit line is connected to the drain regions of at least two of the memory cells. The write, read and erase means are so structured that they can carry out selective write, read and erase operations, wherein twelve voltages (i.e., a selective word line voltage Vkcw and a non-selective word line voltage Vknw for a write operation; a selective word line voltage Vycw and a non-selective word line voltage Vynw for a read operation, a selective word line voltage Vscw and a non-selective word line voltage Vsnw for an erase operation, a selective bit line voltage Vkcb and a non-selective bit line voltage Vknb for a write operation, a selective bit line voltage Vycb and a non-selective bit line voltage Vynb for a read operation, and a selective bit line voltage Vscb and a non-selective bit line voltage Vsnb for an erase operation) are set either according to Vkcw<Vknw=Vycw=Vsnw<Vynw<Vscw and Vknb=Vynb=Vscb<Vkcb=Vycb=Vsnb for a p-type substrate or according to Vkcw>Vknw=Vycw=Vsnw>Vynw>Vscw and Vknb=Vynb=Vscb>Vkcb=Vycb=Vsnb for an n-type substrate, the set voltages of the word line comprise four values and the set voltages of the bit lines comprise two values.

In this solving means, the respective set voltages of the word and bit lines comprise four values and two values respectively. With such set values, the write, read and ease means execute selective WRITE, READ and ERASE operations respectively. Accordingly, the same operation as the above fifteenth solving means is obtained by means of simple voltage setting.

A second embodiment of the present invention shows a 1-bit memory cell of a semiconductor memory device with a 4-terminal structure comprising a semiconductor substrate of a first conductivity type, a source of a second conductivity type, a drain of a second conductivity type and a gate. In the second embodiment, interference between the drain and gate can be easily avoided, and an insulating layer between the drain and the gate is so structured that it can retain charges in a nonvolatile manner by means of band-state controlling. And by using hysteresis effect (that is, the value of a gate induced drain leakage current varies depending on whether the insulating layer holds therein charges), the semiconductor memory device of the second embodiment can execute WRITE, READ or ERASE operation according to the applied voltages to the individual terminals.

As shown in FIG. 23, the second embodiment of the invention provides a seventeenth solving means. A memory cell of a semiconductor memory device in accordance with the second embodiment comprises a semiconductor substrate of a first conductivity type, and a memory cell which comprises a drain region of a second conductivity type which is formed selectively on a surface location of the semiconductor substrate, a source region of a second conductivity type which is formed selectively on a surface location of the semiconductor substrate in a manner such that it is spaced a given distance away from the drain region, an insulating layer which is formed on the semiconductor substrate so that it overlies, at least partly, an edge of the drain region and extends to an edge of the source region, and a gate electrode which is formed on the insulating layer. And the energy gap between the conduction band and the valence band of a semiconductor section (which includes the drain region and the semiconductor substrate) is set to a value not more than a gap value corresponding to a first set voltage difference between the drain region and the gate electrode, while either the energy gap between the valence band of the insulating layer and the valence band of the semiconductor section or the energy gap between the conduction band of the insulating layer and the conduction band of the semiconductor section, at the interface between the semiconductor sectlon and the insulating layer, is set to a gap value corresponding to a second set voltage difference, which varies according to the gate electrode voltages, between the drain region and the semiconductor substrate, so that the insulating layer holds therein charges and is able to store information in a nonvolatile manner.

In this solving means, the memory cell is so structured that charges, which have Jumped the valence band of the insulating layer, are trapped in the insulating layer in a nonvolatile manner. Thus, a state in which a charge is trapped in the insulating layer and another in which no charge is trapped in it can be stored as a "1" and a "0" respectively. As described above, the 1-bit memory cell has a 4-terminal structure, and the source region and the drain region are formed and have the same conductivity type (i.e., a second conductivity type). Accordingly, possible interference between the source and drain regions can be avoided easily when fabricating Integrated circuits. As a result, it is feasible to realize a large scale integration of semiconductor memory devices.

The second embodiment provides an eighteenth solving means in accordance with the seventeenth solving means, wherein the insulating layer of at lease one memory cell is previously shifted to and kept at the state of "1" as a result of pre-trapping of charges, and read means is provided which applies between the drain region and the gate electrode a voltage not less than the first setting voltage difference while it applies between the drain region and the semiconductor substrate a voltage lower than the second setting voltage difference so that the contents of a memory stored is read out by sensing the value of a gate induced drain leakage current.

In this solving means, when a voltage not less than the first set voltage difference is applied between the drain region and the gate electrode by the read means, the bands of the semiconductor section curve beyond the energy gap between the conduction and valence bands. This causes a gate induced drain leakage current resulting from band-to-band tunneling. At this point in time, the value of such a gate induced drain leakage current varies depending on whether the insulating layer holds therein charges. In other words, when the insulating layer holds charges (i.e., is in the state of "1"), the electric filed relaxes due to the presence of the charges trapped. Therefore, the current value at the state of "1" is lower than the state of "0" (i.e., the state in which the insulating layer holds no charges). Accordingly, from the difference in current value, the contents of a memory stored in the insulating layer can be read out as either a "1" or a "0". Further, no charges will jump the valence band (or the conduction band) of the insulating layer and enter the insulating layer, since the voltage between the drain region and the gate electrode voltage is lower than the second set voltage difference. In other words, the information stored in the insulating layer is retained undamaged (i.e., is read out in a non-destructive manner). Accordingly, the present semiconductor memory device may function as a ROM if each memory cell is pre-set to a "0" or "1" state according to, for example, a fixed pattern.

The second embodiment provides a nineteenth solving means in accordance with the seventeenth solving means, wherein write means is provided in the semiconductor memory device. The write means applies between the drain region and the gate electrode a voltage not less than the first set voltage difference while it applies between the drain region and the semiconductor substrate a voltage not less than the second setting voltage difference. As a result, a gate induced drain leakage current occurs, and charges are trapped in the insulating layer. Accordingly, the insulating layer is written into the state of "1".

In this solving means, when a voltage not less than the first set voltage difference is applied between the drain region and the gate electrode by the read means, the bands of the semiconductor section curve beyond the energy gap. This causes a gate induced drain leakage current resulting from band-to-band tunneling. Further, when a voltage not less than the second set voltage difference which varies according to the voltage of the gate electrode is applied between the drain region and the semiconductor substrate, the bands of the semiconductor section curve beyond the energy gap between the valence band of the insulating layer and the valence band of the semiconductor section (or the energy gap between the conduction band of the insulating layer and the conduction band of the semiconductor section), at the interface between the gate electrode and the semiconductor section. As a result, charges will jump the valence band (or the conduction band) of the insulating layer and then are trapped in the insulating layer, thereby the insulating layer being held in the state of "1". The charges trapped and held in the insulating layer are retained nonvolatile until the application of a reverse voltage or the implantation of a reverse polarity charge is applied to the insulating layer. A nonvolatile "1" state can be stored in the insulating layer. Accordingly, the insulating layer can be used as a PROM material by writing specified information into the semiconductor memory device.

The second embodiment provides a twentieth solving means in accordance with the nineteenth solving means, wherein read means is provided, which applies a given voltage to the gate electrode while it applies between the drain region and the semiconductor substrate a voltage lower than the second set voltage difference so that the contents of a memory is read out by sensing the value of a gate induced drain leakage current.

In this solving means, the storage state of a memory cell in the state of "1" (with a charge) and the storage state of a memory cell in the state of "0" (without a charge) are non-destructively read out by the same operation as the nineteenth solving means. As a result, the semiconductor memory device functions as a PROM.

The second embodiment provides a twenty-first solving means in accordance with the seventeenth solving means, wherein the insulating layer of at least one memory cell in the semiconductor memory device is previously shifted to and kept at the state of "1" as a result of pre-trapping of charges, and erase means is provided which applies between the gate electrode and the semiconductor section a given voltage to release the charge trapped from the insulating layer. As a result, the insulating layer transfers to the state of "0".

In this solving means, if a given voltage is applied by the erase means to the gate electrode, with the insulating layer in the state of "1", the trapped charges transfer from the insulating layer to the semiconductor section. In other words, the charges held in the insulating layer disappear, and the information stored in the insulating layer is changed to the state of "0". Therefore, it is possible to rewrite the information that has already been written to the semiconductor memory device.

The second embodiment provides a twenty-second solving means in accordance with the twentieth solving means, wherein erase means is provided, which applies a given voltage to the gate electrode of the memory cell which holds charges and is in the state of "1" to release the charges trapped from the insulating layer. As a result, the insulating layer transfers to the state of "0".

In this solving means, if a given voltage is applied by the erase means to the gate electrode with the insulating layer in the state of "1", the same operation as the above twenty-first solving means is obtained. Therefore, the semiconductor memory device can serve as an EEPROM capable of executing WRITE, READ or ERASE operation.

The second embodiment provides a twenty-third solving means in accordance with the seventeenth solving means, wherein the insulating layer of at least one memory cell is previously shifted to and kept at the state of "1" as a result of pre-trapping of charges, and erase means is provided which imposes between both faces of the insulating layer in the state of "1" a high electric field to cause a Fowler-Nordheim current, so that a resulting reverse polarity charges are implanted into the insulating layer. As a result, the insulating layer transfers to the state of "0".

In this solving means, if a high electric field is imposed by the erase means between both faces of the insulating layer, with the insulating layer of the memory cell in the state of "1", an FN current occurs thereby causing reverse polarity charges to flow into the insulating layer. As a result, such reverse polarity charges recombine with the charges held in the insulating layer. The charges held in the insulating layer disappear, and the information stored in the insulating layer transfers to the state of "0". Accordingly, it is possible to rewrite the information stored in the semiconductor memory device.

The second embodiment provides a twenty-fourth solving means in accordance with the twentieth solving means, wherein erase means is provided in the semiconductor memory device. The erase means imposes between both faces of the insulating layer which is in the state of "1" a high electric field to cause a Fowler-Nordheim current, so that resulting reverse polarity charges are implanted into the insulating layer. As a result, the insulating layer transfers to the state of "0".

In this solving means, if a high electric field is imposed by the erase means between both faces of the insulating layer with the insulating layer of the memory cell in the state of "1", the same operation as the above twenty-third solving means is obtained. Therefore, the semiconductor memory device can serve also as an EEPROM capable of electrically executing WRITE, READ or ERASE operation.

The second embodiment provides a twenty-fifth solving means in accordance with the seventeenth solving means, wherein the insulating layer of at least one memory cell is previously shifted to and kept at the state of "1" as a result of pre-trapping of charges. And erase means is provided, which applies, with the gate electrode set at a fixed voltage, a given voltage between the drain and source regions to generate a drain to source current so that hot carriers having a reverse polarity with respect to the charge held are implanted into the insulating layer, thereby transferring the insulating layer to the state of "0".

In this solving means, with the insulating layer in the state of "1", if such a fixed voltage is applied between the drain and the source under a given gate bias, a channel current flows on the surface of the semiconductor substrate between the drain and the source. And a high electric field is imposed in the direction of the channel by the drain voltage, so that the channel current partly becomes hot carriers and flows into the insulating layer. Then, since the hot carriers have a reverse polarity with respect to the charges held in the insulating layer, they are neutralized. As a result, the insulating layer shifts from a "1" to a "0". Accordingly, the information stored in the semiconductor device can be rewritten.

The second embodiment provides a twenty-sixth solving means in accordance with the twentieth solving means, wherein erase means is provided, which applies, with the gate electrode set at a fixed voltage, a given voltage between the drain and source regions to generate a drain to source current so that hot carriers having a reverse polarity with respect to the charges held are implanted into the insulating layer, thereby transferring the insulating layer to the state of "0".

In this solving means, with the insulating layer in the state of "1", if such a fixed voltage is applied by the erase means between the drain and the source under a given gate bias, the same operation as the above twenty-fifth solving means is obtained. Therefore, it is possible that the semiconductor memory device can serve as an EEPROM capable of electrically executing WRITE, READ or ERASE operation.

The second embodiment provides a twenty-seventh solving means in accordance with the seventeenth solving means, wherein the insulating layer of each of the memory cells is previously shifted to and kept at the state of "1" as a result of pre-trapping of charges.

In this solving means, each of the insulating layers has been held in the state of "1" in advance, and is then shifted to the state of "0" so that a "0" WRITE operation is executed. The contents of a memory can be erased by bringing the insulating layer into the state of "1" again. The value of a gate induced drain leakage current occurring when the insulating layer is in the state of "1" is lower than in the state of "0", when a READ operation is carried out to read the contents of a memory from the insulating layer. Accordingly, taking the fact that the number of memory cells actually to be used is generally not many into account, the write operation according to the this embodiment requires less power than a write operation which is executed by changing the insulating layer from a "0" to a "1".

The second embodiment provides a twenty-eighth solving means in accordance with the nineteenth solving means. At least four memory cells, at least two word lines and at least two bit lines are provided. Each word line is connected to the gate electrodes of at least two of the memory cells, and each bit line is connected to the drain regions of at least two of the memory cells. The write means is so structured that it can selectively write the contents of a memory wherein four voltages (i.e., a selective word line voltage Vkcw, a non-selective word line voltage Vknw, a selective bit line voltage Vkcb and a non-selective bit line voltage Vknb) are set either according to Vkcw<Vknw and Vknb<Vkcb for a p-type substrate or according to Vkcw>Vknw and Vknb>Vkcb for an n-type substrate, the set voltages of the word lines comprise two values and the set voltages of the bit lines comprise two values.

In this solving means a selective WRITE operation can be executed by means of simple voltage setting, which results in a high speed operation. Additionally, the peripheral circuitry of power circuits is simplified, allowing a large scale integration to be realized. Furthermore, the semiconductor memory device can function as a PROM capable of executing a selective WRITE operation per bit.

The second embodiment provides a twenty-ninth solving means in accordance with the eighteenth or twentieth solving means. At least four memory cells, at least two word lines and at least two bit lines are provided. Each word line is connected to the gate electrodes of at least two of the memory cells, and each bit line is connected to the drain regions of at least two of the memory cells. The read means is so structured that it can selectively read out the contents of a memory wherein four voltages (i.e., a selective word line voltage Vycw, a non-selective word line voltage Vynw, a selective bit line voltage Vycb and a non-selective bit line voltage Vynb) are set either according to Vycw Vynw and Vynb<Vycb for a p-type substrate or according to Vycw>Vynb and Vynb>Vycb for an n-type substrate, and the set voltages of the word lines comprise two values and the set voltages of the bit lines comprise two values.

In this solving means, a selective READ operation can be executed by means of simple voltage setting, which results in a high speed operation. Additionally, the peripheral circuitry of power circuits is simplified, allowing a large scale integration to be realized. Furthermore, the semiconductor memory device can function as a ROM or a PROM capable of executing a selective READ operation per bit.

The second embodiment provides a thirtieth solving means in accordance with the twentieth solving means. At least four memory cells, at least two word lines and at least two bit lines are provided. Each word line is connected to the gate electrodes of at least two of the memory cells, and each bit line is connected to the drain regions of at least two of the memory cells. The write and read means are so structured that they can carry out a selective write operation and a selective read operation respectively wherein eight voltages (i.e., a selective word line voltage Vkcw and a non-selective word line voltage Vknw for a write operation, a selective word line voltage Vycw and a non-selective word line voltage Vynw for a read operation, a selective bit line voltage Vkcb and a non-selective bit line voltage Vknb for a write operation and a selective bit line voltage Vycb and a non-selective bit line voltage Vynb for a read operation) are set either according to by Vkcw=Vycw<Vknw=Vynw and Vknb=Vynb<Vycb<Vkcb for a p-type substrate or according to Vkcw=Vycw>Vknw=Vynw and Vknb=Vynb>Vycb>Vkcb for an n-type substrate, the set voltages of the word lines comprise two values and the set voltages of the bit lines comprise three values.

In this solving means, a high operating speed as well as a large scale integration can be realized, accordingly. The semiconductor memory device can function as a PROM capable of executing a selective WRITE or READ operation per bit.

The second embodiment provides a thirty-first solving means in accordance with the twenty-second, twenty-fourth or twenty-sixth solving means. At least four memory cells, at least two word lines and at least two bit lines are provided. Each word line is connected to the gate electrodes of at least two of the memory cells, and each bit line is connected to the drain regions of at least two of the memory cells. The write, read, and erase means are so structured that they can carry out a selective write operation, a selective read operation and an erase operation for deleting the stored information in all of the memory cells sharing a common word line respectively wherein twelve voltages (i.e., a selective word line voltage Vkcw and a non-selective word line voltage Vknw for a write operation, a selective word line voltage Vycw and a non-selective word line voltage Vynw for a read operation, a selective word line voltage Vscw and a non-selective word line voltage Vsnw for an erase operation, a selective bit line voltage Vkcb and a non-selective bit line voltage Vknb for a write operation, a selective bit line voltage Vycb and a non-selective bit line voltage Vynb for a read operation, and a selective bit line voltage Vscb and a non-selective bit line voltage Vsnb for an erase operation are set either according to Vkcw=Vycw<Vknw=Vynw=Vsnw<Vscw and Vknb=Vynb=Vscb=Vsnb<Vycb<Vkcb for a p-type substrate or according to Vkcw=Vycw>Vknw=Vynw=Vsnw>Vscw and Vknb=Vynb=Vscb=Vsnb>Vycb>Vkcb for an n-type substrate, the set voltages of the word lines comprise three values and the set voltages of the bit lines comprise three values.

In this solving means, a high operating speed can be achieved by simple voltage setting. And the peripheral circuitry of power circuits is simplified, allowing a large scale integration to be realized. Furthermore, the semiconductor memory device can function as an EEPROM capable of executing a selective WRITE or READ operation per bit, or a partial ERASE operation per word line.

The second embodiment provides a thirty-second solving means in accordance with the twenty-second, twenty-fourth or twenty-sixth solving means. At least four memory cells, at least two word lines and at least two bit lines are provided. Each word line is connected to the gate electrodes of at least two of the memory cells, and each bit line is connected to the drain regions of at least two of the memory cells. The write, read and erase means are so structured that they can carry out a selective write operation, a selective read operation and an erase operation for deleting the contents of a memory in the memory cells connected to each word line wherein twelve voltages (i.e., a selective word line voltage Vkcw and a non-selective word line voltage Vknw for a write operation, a selective word line voltage Vycw and a non-selective word line voltage Vynw for a read operation, a selective word line voltage Vscw and a non-selective word line voltage Vsnw for an erase operation, a selective bit line voltage Vkcb and a non-selective bit line voltage Vknb for a WRITE operation, a selective bit line voltage Vycb and a non-selective bit line voltage Vynb for a read operation, and a selective bit line voltage Vscb and a non-selective bit line voltage Vsnb for an erase operation are set either according to Vkcw=Vycw<Vknw=Vsnw=Vynw<Vscw and $Vknb=Vynb=Vscb<Vycb<Vkcb=Vscb=Vsnb$ for a p-type substrate or according to $Vkcw=Vycw>Vynw>Vknw=Vsnw=Vynw>Vscw$ and $Vknb=Vynb>Vycb>Vkcb=Vscb=Vsnb$ for an n-type substrate, the set voltages of the word lines comprise three values and the set voltages of the bit lines comprise three values.

In this solving means, the write, read and erase means execute selective WRITE and READ operations and a partial ERASE operation per word line respectively using a different inequality relationship between voltage values from the thirty-first solving means, wherein the set voltages of the word lines comprise three values while those of the bit lines comprise three values. Therefore, the same operation as the thirty-first solving means is obtained.

A thirty-third solving means in accordance with the first or seventeenth solving means is provided in the second embodiment wherein the semiconductor substrate is formed of a Si, and the insulating layer is formed of a $SiO_2$.

Accordingly, the insulating layer can be grown by means of the oxidation of S1 substrate. Therefore, the properties of the insulating layer are improved. Additionally, semiconductor memory devices can be made easily, and lower costs can be achieved. Further, $SiO_2$ has a strong affinity for Si so that possible stress to the Si substrate is controlled to a relatively low degree. And operating voltages at TTL levels can be realized because the band barrier height between Si and $SiO_2$ is about 3.5 eV.

A thirty-fourth solving means in accordance with the first or seventeenth solving means is provided in the second embodiment wherein the insulating layer is formed of a plurality of layers.

Accordingly, by giving one of the insulating layers a high dielectric constant, the increase of thickness of the layer can be achieved, and electrical pressure resistance can be improved. Additionally, charges are apt to be trapped at the interface between the insulating layers so that the efficiency of charge trapping for a WRITE operation is improved. The read current difference between "0" and "1" states is widened so that a READ operation is more easily executed. Such an expansion of the read current difference enables the miniaturization of memory cells and of peripheral current amplifier circuits. Therefore, a much larger scale integration can be achieved.

The last solving means in accordance with the first or seventeenth solving means is provided wherein a floating gate electrode is formed in the insulating layer for trapping a charge therein.

Accordingly, the read current difference between "0" and "1" states is expanded so that this solving means has the same operation as the thirty-fourth solving means. Additionally, the durability of the insulating layer of this solving means is improved in comparison with an insulating layer of the type which traps and detraps charges.

BRIEF DESCRIPTION OF THE DRAWINGS

FIG. 21 is a timing chart showing a "1" WRITE circuit operation, a "0" WRITE circuit operation and a READ circuit operation (2) in the first embodiment.

FIG. 29 is a timing chart showing a "1" WRITE circuit operation, a "0" WRITE circuit operation and a READ circuit operation (2) in the second embodiment.

DESCRIPTION OF THE PREFERRED EMBODIMENTS

Each of the preferred embodiments of the invention will be described with reference to the accompanying drawings.

FIRST EMBODIMENT

Figure 1A:
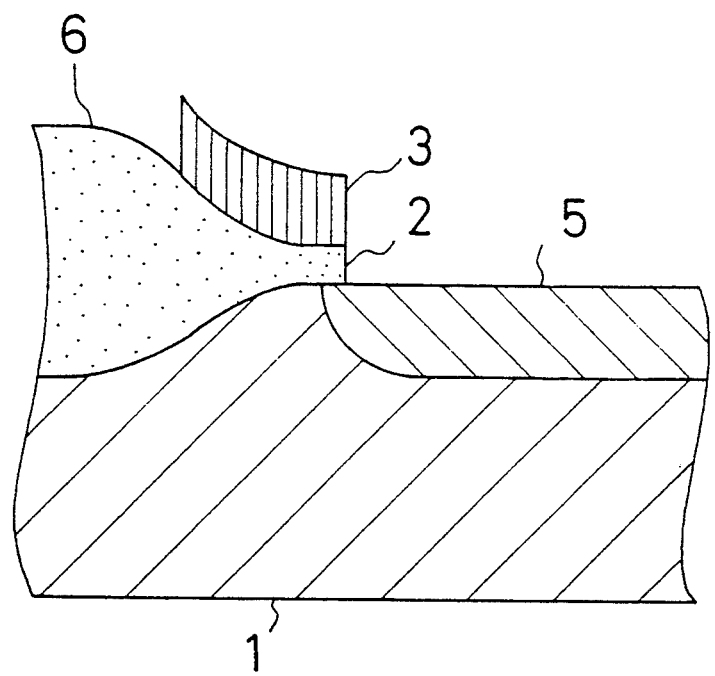
FIG. 1 (a and b) shows a cross-sectional structure of a memory cell of the semiconductor memory device in accordance with a first embodiment of the invention and circuit symbols.

The first embodiment will be described which relates to the first to sixteenth solving means. FIG. 1a depicts a cross-sectional structure of a 1-bit memory cell of the first embodiment of the invention. Formed on the surface of a semiconductor substrate 1 of a p-type (a first conductivity type) is a drain region 5 of an n-type (a second conductivity type) formed by means of phosphorus doping or the like. A gate oxide layer 2 of $SiO_2$ serving as an insulating layer is formed on the semiconductor substrate 1, extending over and covering partly an edge of the drain region 5. As will be described later, the gate oxide layer 2 is a location where electric charges are trapped to store information in a nonvolatile manner. Additionally, the gate oxide layer 2 becomes thicker at its left-hand side to form a cell isolation section 6. Provided on the surface of the gate oxide layer 2 is a gate electrode 3, of a polycrystalline silicon layer, which extends from an edge of the gate oxide layer 2 to a portion of the cell isolation section 6. As described above, 1-bit memory cells comprise the semiconductor substrate 1, the drain region 5, the gate oxide layer 2 and the gate electrode 3.

Trial products of the above semiconductor memory device have been made, wherein the thickness of the gate oxide layer 2, Tox is 7 nm, the gate electrode 3 is an n+polycrystalline silicon layer, and the width of the gate electrode 3, W is 20 μm. The drain region 5 is formed by means of As ion implantation using accelerating energy of 40 keV and a dose of $6.0 \times 10^{15}$(ions/cm$^2$).

Figure 1B:
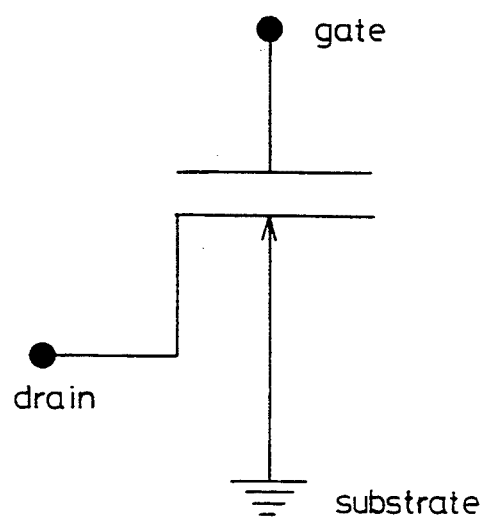

There are provided no source regions in the semiconductor memory in accordance with the first embodiment. The present memory cell is represented by a circuit diagram as shown in FIG. 1b, and has a 3-terminal structure. Additionally, word lines WLn and bit lines BLn in a semiconductor memory circuit are connected to the gate electrodes 3 and the drain regions 5, respectively.

Figure 2:
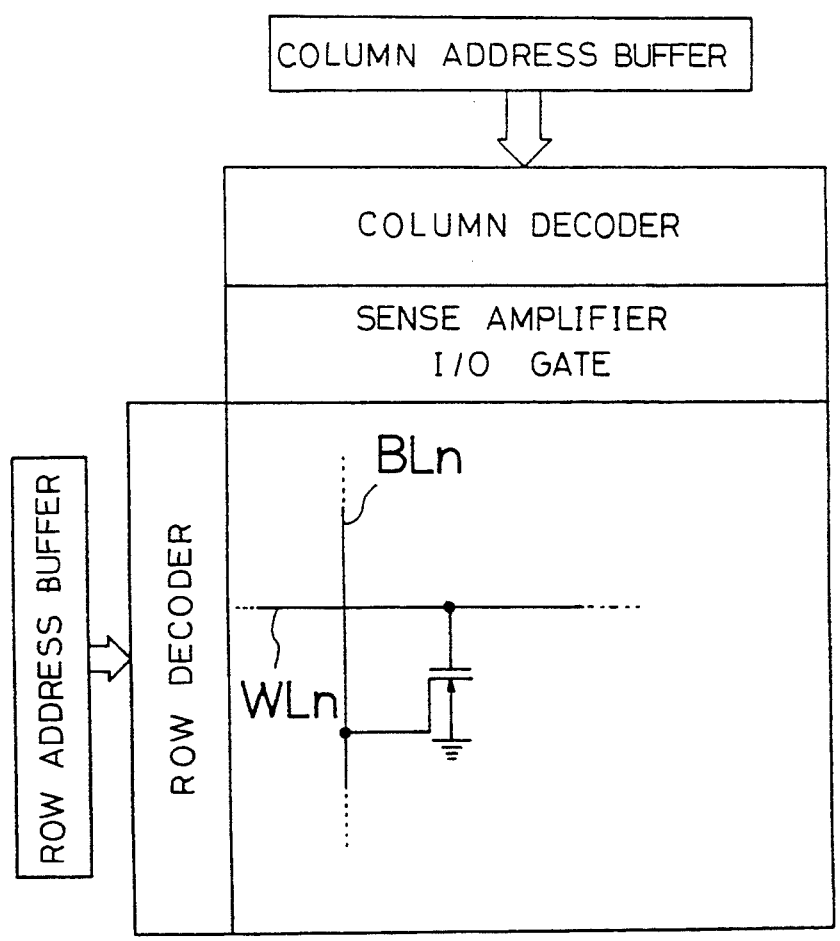
FIG. 2 shows a block diagram of an integrated circuit of the first embodiment.

The integrated circuit of the present semiconductor memory device comprises a row decoder to select a memory cell array and a word line, a column decoder to select a bit line and a sense amplifier to amplify data read out of the bit line, as shown in FIG. 2.

Basic operations including WRITE, READ and ERASE operations according to the above memory cell will be described by taking an example in which a p-type Si substrate, an n-type drain region and a gate oxide layer of $SiO_2$ are utilized.

1. Basic Operations

1) "1" WRITE Operation (1)

Figure 3A:
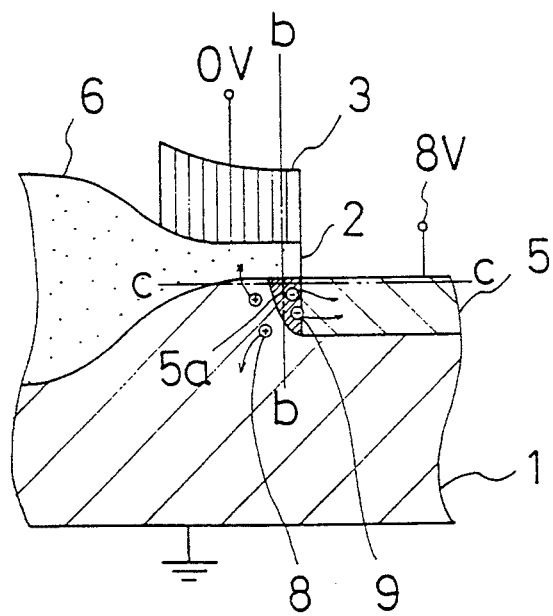
FIG. 3 (a, b and c) shows diagrams of a "1" WRITE operation (1) in the first embodiment.
Figure 3B:
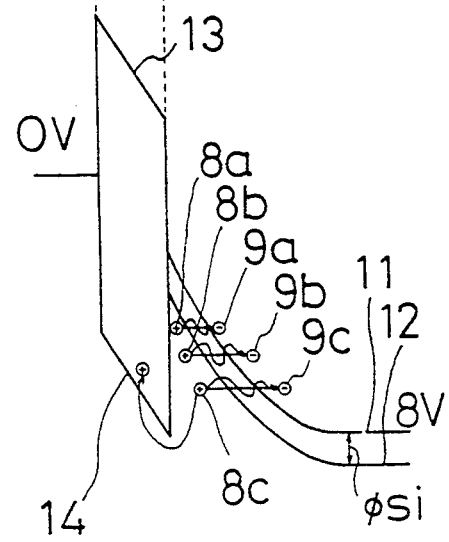
Figure 3C:
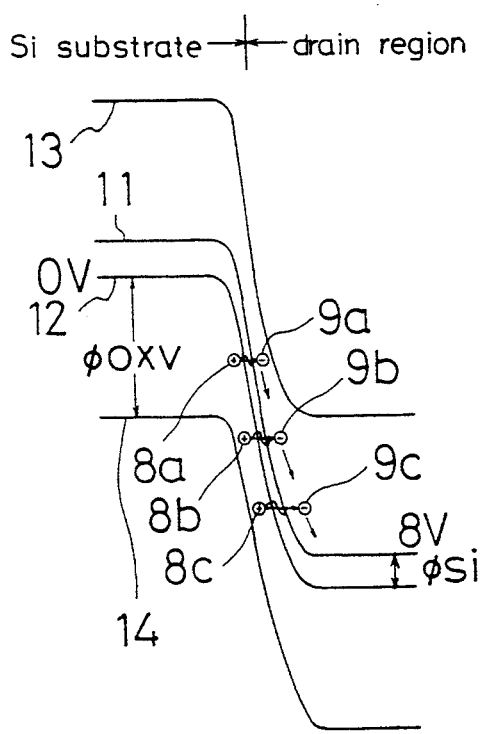

FIG. 3a is a cross-sectional view of the basic operation of a "1" WRITE operation (1) of the first embodiment. FIG. 3b is an energy band picture taken along line b—b in FIG. 3a. FIG. 3c is an energy band picture between the drain region 5 and the semiconductor substrate 1 taken along line c—c in FIG. 3a.

As shown in FIG. 3b, if a gate voltage Vg, a substrate voltage Vsub, and a drain voltage Vds are set to 0 V, 0 V and a voltage not less than 8 V respectively, a conduction band 11 and a valence band 12 of the semiconductor Si curve beyond an energy gap $\phi$si in the direction perpendicular to the interface between the Si substrate and the gate oxide layer 2, so that electrons 9 (a, b and c) and holes 8 (a, b and c) are generated in a gate-drain overlapped region 5a due to band-to-band tunneling taking place. At the same time, as shown in FIG. 3c, the bands 11 and 12 of semiconductor Si also curve in the direction parallel with respect to the interface between the Si substrate and the $SiO_2$ layer. Further, a conduction band 13 and a valence band 14 of the gate oxide layer 2 also curve, so that the energy level of, for example, the hole 8c caused by band-to-band tunneling is lower than the valence band 14 in the region of the Si substrate 1. As a result, the hole 8c can easily jump the valence band 14 of the gate oxide layer 2 at the interface between the Si substrate and the $SiO_2$ layer. Then, as shown in FIG. 3b, the hole 8c is trapped in the gate oxide layer 2. In other words, the state of "1" (i.e., a charge holding state) is stored in a nonvolatile manner in the gate oxide layer 2, which will be described later. By this operation, the write means of the third solving means is constructed.

For the hole 8 to readily jump the valence band 14 of the gate oxide layer 2, the voltage between the drain and the substrate must be not less than a difference $\phi$ox between the valence band 14 of the gate oxide layer 2 ($SiO_2$) of the region of the Si substrate 1 and the valence band 12 of the Si substrate 1.

Figure 4:
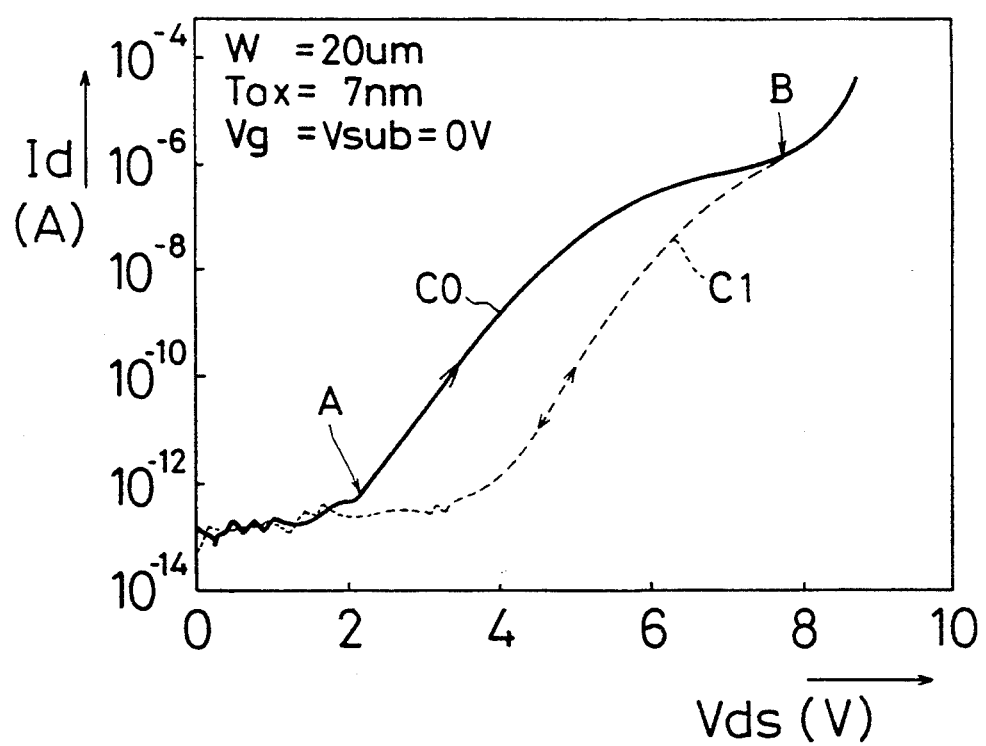
FIG. 4 is a characteristic diagram showing current-voltage characteristics in a "1" WRITE operation (1).
Figure 5A:
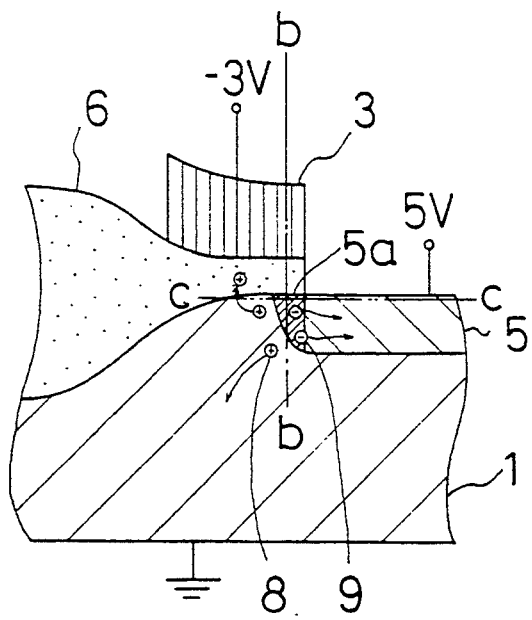
FIG. 5 (a, b and c) shows diagrams of a "1" WRITE operation (2) in the first embodiment.
Figure 5B:
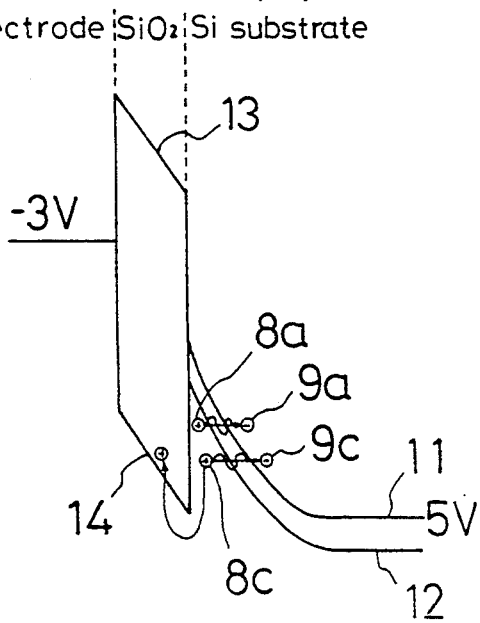
Figure 5C:
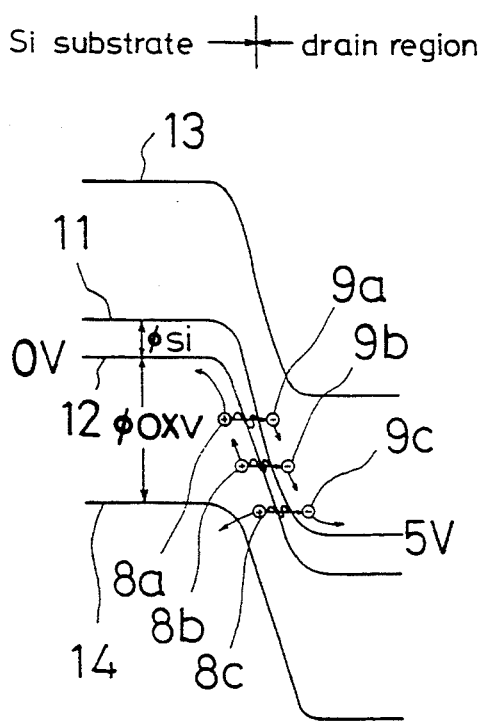

FIG. 4 is a characteristic diagram showing current-voltage characteristics in the foregoing "1" WRITE operation. In FIG. 4, the abscissa indicates the drain to substrate voltage Vds, whereas the ordinate indicates the drain current Id. With the substrate voltage Vsub=0 V and a gate voltage Vg=0 V, the drain to substrate voltage Vds is swept from 0 V to 9 V to measure the drain current Id. A current flows between the drain and the substrate, since gate induced drain leakage current occurs in the gate-drain overlapped region 5a. In FIG. 4, Curve C0 indicated by solid line shows a drain-current to drain-voltage characteristic curve in the first measurement. Curve C1 indicated by broken line shows a drain-current to drain-voltage characteristic curve at the second and subsequent measurements. It is observed that the threshold voltage of a gate induced drain leakage current measured at the second and subsequent measurements is greater than the first measurement. Such a high threshold voltage is continuously and constantly kept.

Each Curve C0 indicates the state of "0", while each Curve C1 indicates the state of "1" throughout the following characteristic diagrams.

A Fowler-Nordheim current is generated in the semiconductor memory device whose threshold voltage of a gate induced drain leakage current has become high, under such a condition that the gate voltage Vg, the drain to substrate voltage Vds, and the substrate voltage Vsub are set to −7 V, 0 V and 0 V respectively. Thereafter, under the same measurement condition as the one shown in FIG. 4 (i.e., the drain to substrate voltage Vds is swept from 0 V to 9 V with the substrate voltage=0 V and the gate voltage=0 V), the drain current Id is measured. The same drain-current to drain-voltage characteristic curve as the curve C0 of FIG. 4 is obtained. That is to say, the threshold voltage of the gate induced drain leakage current in the semiconductor memory device returns to the initial state due to the FN current.

In FIG. 4, Point A indicates a sub-breakdown point at which the gate induced drain leakage current starts occurring (the voltage difference between the drain and the gate, at this point in time, is a first set voltage difference as defined In the first solving means), and Point B indicates a deep breakdown point at which the gate induced drain leakage current taking place in the state of "0" becomes equal to that taking place in the state of "1" (the voltage difference between the drain and the substrate under a given gate voltage is a second set voltage difference as defined in the first solving means). That is, if the drain to substrate voltage Vds is below the sub-breakdown Point B, no band-to-band tunneling occurs. On the contrary, if the drain to substrate voltage Vds is above the deep breakdown Point B, band-to-band tunneling occurs and charges will easily jump between valence bands. Accordingly, the holes 8 are trapped.

Taking an allowance for an applied voltage to the gate oxide layer 2 into account, a gap value (2.1 eV) corresponding to the first set voltage difference (for example, 2.1 V) is made greater than the energy gap value (1.1 eV) of Si, at the sub-breakdown Point A. In other words, the energy gap between the conduction and valence bands of the semiconductor section is set to not more than the first set voltage difference between the drain and the gate. And the deep breakdown Point B varies, depending on the gate voltage Vg, which will be described later. These first and second set voltage differences can be correctly determined on the basis of the voltage difference design for WRITE, READ and ERASE operations. In addition thereto, based on the first and second set voltage differences, it is possible to adapt the energy gap values of the semiconductor substrate 1, the drain region 5 and the gate oxide layer 2 by controlling the dosing amount of dopant to the drain region 5, the thickness of the gate oxide layer 2, and material quality. Therefore, it is to be appreciated that the values of the first and second set voltage differences are not limited to the ones as shown in this embodiment.

In this embodiment, since the semiconductor substrate 1 of a p-type is used, the energy gap between the valence band of the gate oxide layer 2 and the valence band of the semiconductor substrate is set to a gap value corresponding to the second set voltage difference. However, for an n-type semiconductor substrate, the energy gap between the conduction band of the gate oxide layer 2 and the conduction band of the semiconductor substrate should be set to a gap value corresponding to the second set voltage difference.

The state in which the threshold voltage of a gate induced drain leakage current is low (i.e., Curve C0 of FIG. 4) is defined as a "0" state. On the other hand, the state in which the threshold voltage of a gate induced drain leakage current is high (i.e., Curve C1 of FIG. 4) is defined as a "1" state. The fact that gate induced drain leakage current varies, depending on whether there exists a charge, can be utilized as a memory.

2) "1" WRITE Operation (2)

Figure 6:
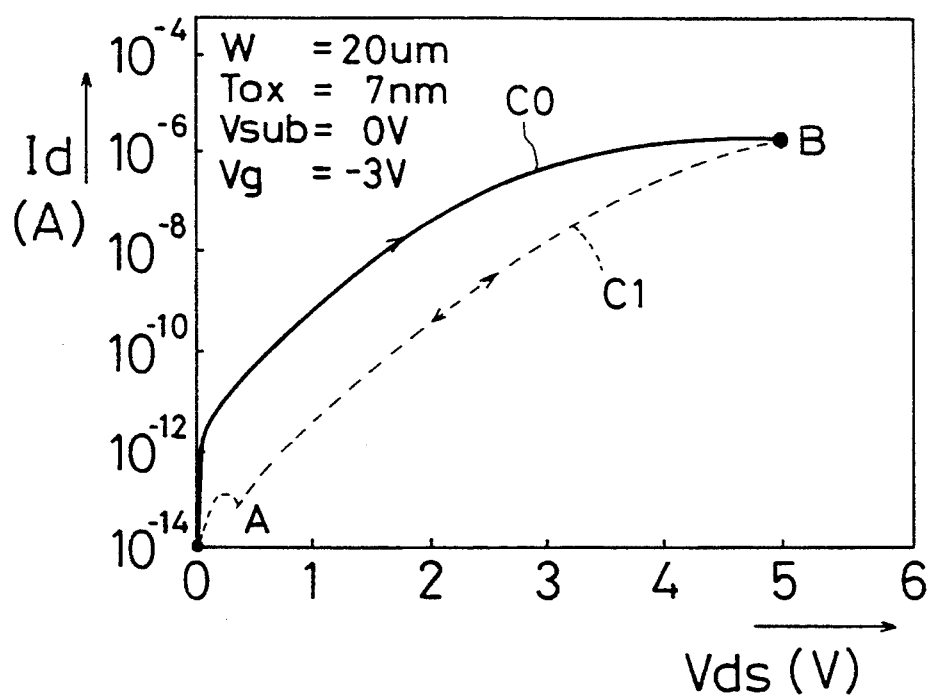
FIG. 6 is a characteristic diagram showing current-voltage characteristics in a "1" WRITE operation (2).

In the above description, the gate and drain voltages are set to 0 V and 8 V, respectively. It is however to be understood that the write means of the present invention is not limited to such values. For example, the same operation can be obtained by setting the gate voltage Vg, the substrate voltage Vsub and the drain voltage to −3 V, 0 V and a voltage not less than 5 V, respectively. FIG. 6 shows current-voltage characteristics in a "1" WRITE operation when the gate voltage Vg, the substrate voltage Vsub and the drain voltage Vds are set to −3 V, 0 V and a voltage not less than 5 V, respectively. In the Figure, the abscissa indicates the drain to substrate voltage Vds, whereas the ordinate indicates the drain current Id. At the sub-breakdown Point A, the Vds is 0 V, and at the deep breakdown Point B, the Vds makes a shift to 5 V. That is to say, the voltage value of the deep breakdown point varies depending upon the voltage of the gate electrode 3. By making the gate voltage Vg negative, as shown in FIG. 6, it is possible to advantageously lower the drain to substrate voltage Vds.

3) READ Operation (1)

Figure 7A:
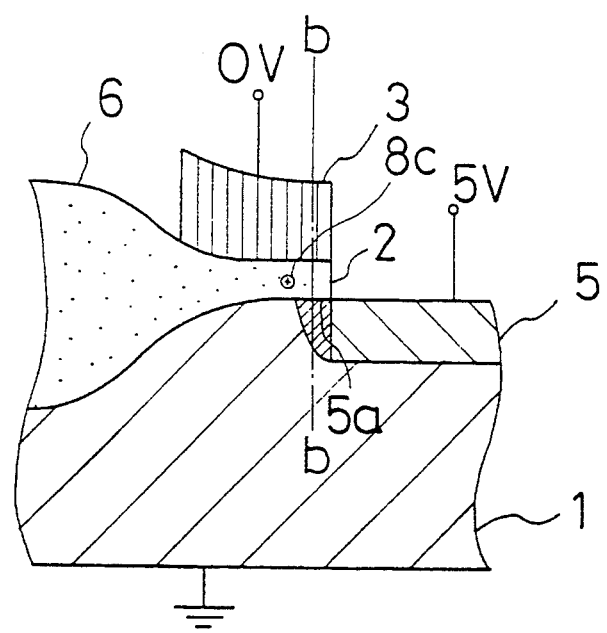
FIG. 7 (a and b) shows diagrams illustrating a "1" READ operation (1) in the first embodiment.
Figure 7B:
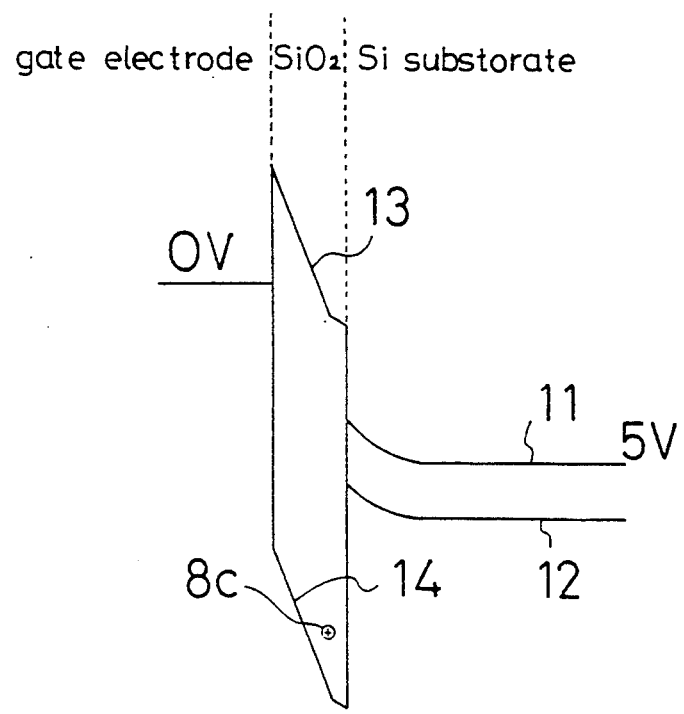

FIG. 7a depicts a cross-sectional structure of a memory cell at the time that the state of "1" is being read out by means of a READ operation (1). FIG. 7b is an energy band picture taken along line b—b in FIG. 7a.

The hole 8c, trapped in the gate oxide layer 2 as a result of a "1" WRITE operation, relaxes the electric field of the gate-drain overlapped region 5a, so that the bands 11 and 12 of the semiconductor Si hardly curve in the region 5a in the direction perpendicular to the interface between the Si substrate and the gate oxide layer 2 even though setting the gate voltage Vg, the substrate voltage Vsub and drain voltage Vds to 0 V, 0 V and 5 V respectively (see FIG. 7b). Accordingly, the band-to-band tunneling hardly occurs.

Figure 8A:
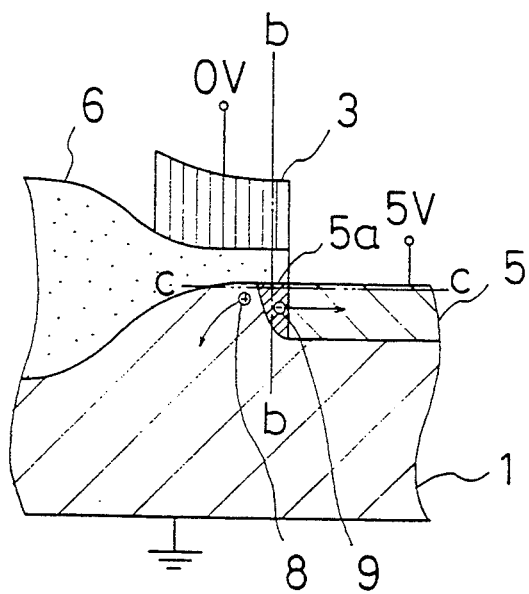
FIG. 8 (a, b and c) shows diagrams of a "0" READ operation (1) in the first embodiment.
Figure 8B:
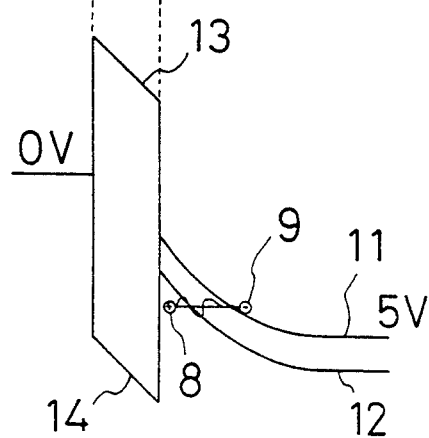
Figure 8C:
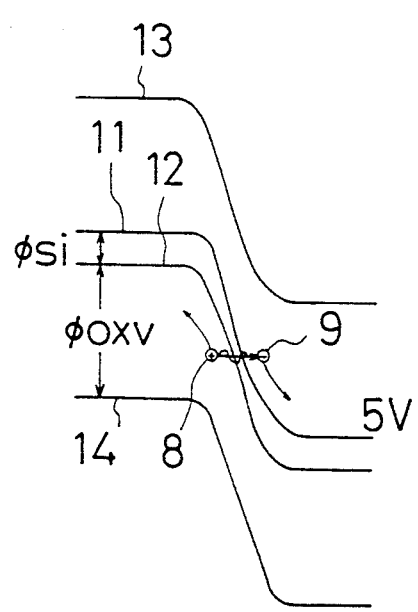

Next, FIG. 8a is a cross-sectional view of a memory cell at the time of the state of "0" being read out by a READ operation (1). And FIG. 8b is an energy band picture taken along line b—b in FIG. 8a. FIG. 8c is another energy band picture taken along line c—c of FIG. 8a.

In the semiconductor memory device in the state of "0" (i.e., "after erasing", which will be described below), no holes are trapped in the gate oxide layer 2. Accordingly, the electric field of the gate-drain overlapped region 5a is not relaxed. If the Vg, Vsub and Vds are set to 0 V, 0 V and 5 V, respectively, the bands 11 and 12 of the semiconductor Si curve beyond the energy gap $\phi$ si in the direction perpendicular to the interface between the Si substrate and the gate oxide layer 2. An electron 9 and the hole 8 are generated by band-to-band tunneling, as a result of which a drain current flows. On the other hand, as shown in FIG. 8c, neither the conduction band 11 of the semiconductor S1 nor the conduction band 13 of the gate oxide layer 2 curves much in the direction parallel to the interface between the Si substrate and the SiO$_2$ layer. The energy level of the hole 8 caused by the band-to-band tunneling phenomenon is higher than the valence band 14 in the region of the S1 substrate 1. The hole 8 is unable to jump the valence band 14 of the gate oxide layer 2 at the interface between Si and SiO$_2$, so that it will not be trapped in the gate oxide layer 2. Therefore, the semiconductor memory device of the invention can execute a READ operation in a non-destructive manner. By the above operation, the READ means of the second or fourth solving means is constructed.

The drain to substrate voltage Vds is set to a voltage between the sub-breakdown Point A and the deep breakdown Point B as shown in FIG. 4, (that is to say, the Vds is set to a voltage not less than the first set voltage difference but lower than the second set voltage difference). And a READ operation is executed by sensing the drain current value at this time. For a trial semiconductor memory device, if the Vds of 5 V is applied as a read voltage when both the gate and substrate voltages Vg and Vsub are set to 0 V, the ratio of the current value in the state of "0" to another in the state of "1" becomes greatest.

Figure 9:
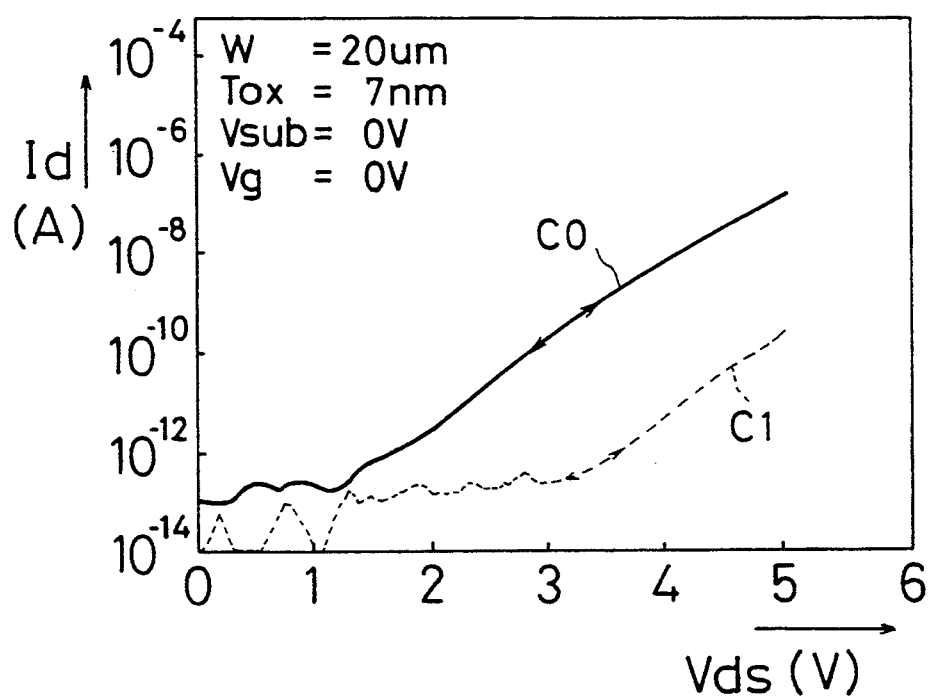
FIG. 9 is a characteristic diagram showing current-voltage characteristics in a READ operation (1).

FIG. 9 shows current-voltage characteristics when both the gate and substrate voltages Vg and Vsub are set to 0 V. The abscissa indicates the drain to substrate voltage Vds, whereas the ordinate indicates the drain current Id. The drain to substrate voltage Vds is swept from 0 V to 5 V and vice versa. From the fact that "0" and "1" states are individually held, it is obvious that the semiconductor memory device of the present invention has a nonvolatile memory function.

Figure 10:
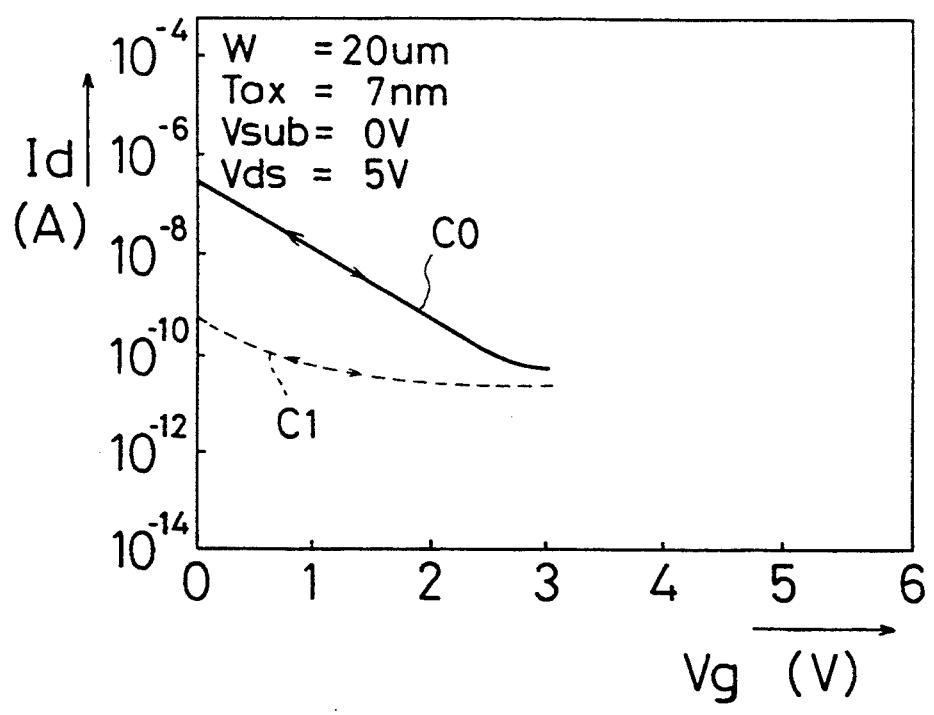
FIG. 10 is a characteristic diagram showing current-voltage characteristics in a READ operation (1').

FIG. 10 shows current-voltage characteristics in which the drain and substrate voltages Vds and Vsub are set to 5 V and 0 V, respectively. In the Figure, the abscissa indicates the gate voltage Vg, whereas the ordinate indicates the drain current Id. The gate voltage Vg is swept from 0 V to 3 V and vice versa. "0" and "1" states are individually held. From this, a READ operation also can be executed by setting the Vg to 3 V, then the Vd to 5 V, and the Vg to 0 V. This is one of the advantages resulting from the fact that no source regions are provided.

4) READ Operation (2)

Figure 11A:
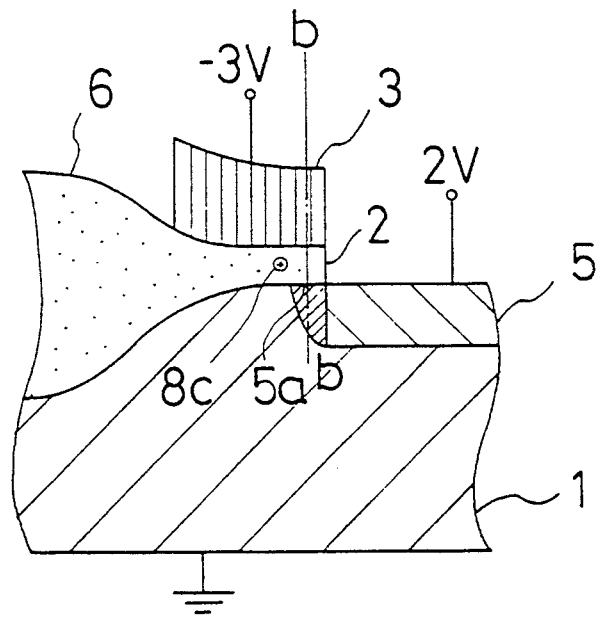
FIG. 11 (a and b) shows diagrams of a "1" READ operation (2) in the first embodiment.
Figure 11B:
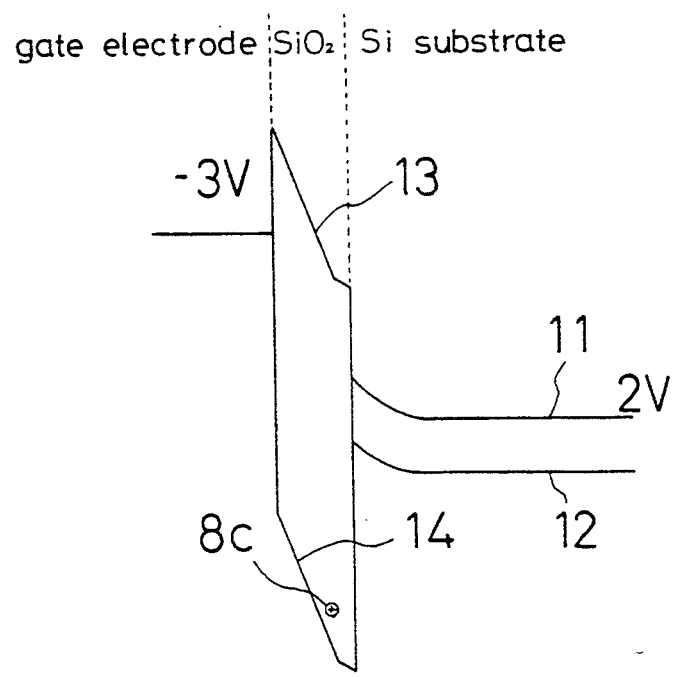

In the semiconductor memory device in the state of "1", the above operation is almost the same as the one in which the gate, substrate and drain voltages Vg, Vsub and Vds are set to −3 V, 0 V and 2 V, respectively. FIG. 11a shows a cross-sectional view of a memory cell at this point in time. FIG. 11b is an energy band picture taken along line b—b in FIG. 11a. As seen from a band state in FIG. 11b, band-to-band tunneling hardly occurs for the same reasons as previously explained with regard to FIG. 7b.

Figure 12A:
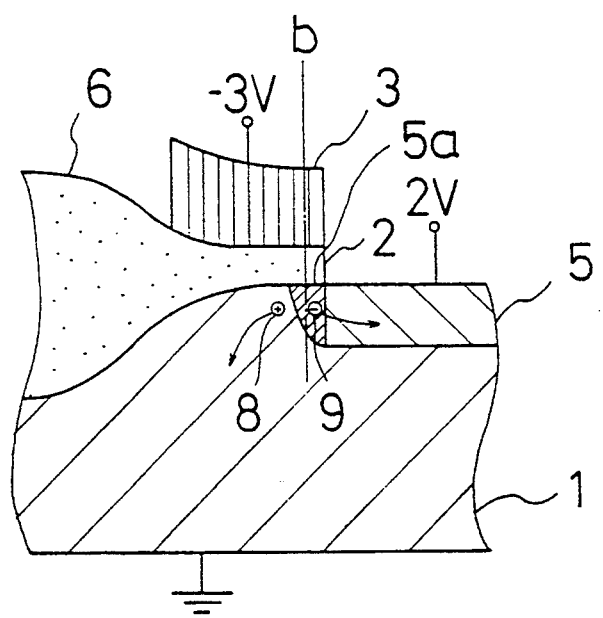
FIG. 12 (a and b) shows diagrams of a "0" READ operation (2) in the first embodiment.

On the other hand, in the semiconductor memory device in the state of "0" ("after erasing"), the band-to-band tunneling occurs if the gate, substrate, drain voltages Vg, Vsub and Vds are set to −3 V, 0 V and 2 V, respectively, which is shown in FIGS. 12a and b. However, the hole 8 makes no jumps into the valence band 14 of the gate oxide layer 2. Accordingly, the hole 8 is not trapped in the gate oxide layer 2.

Figure 13:
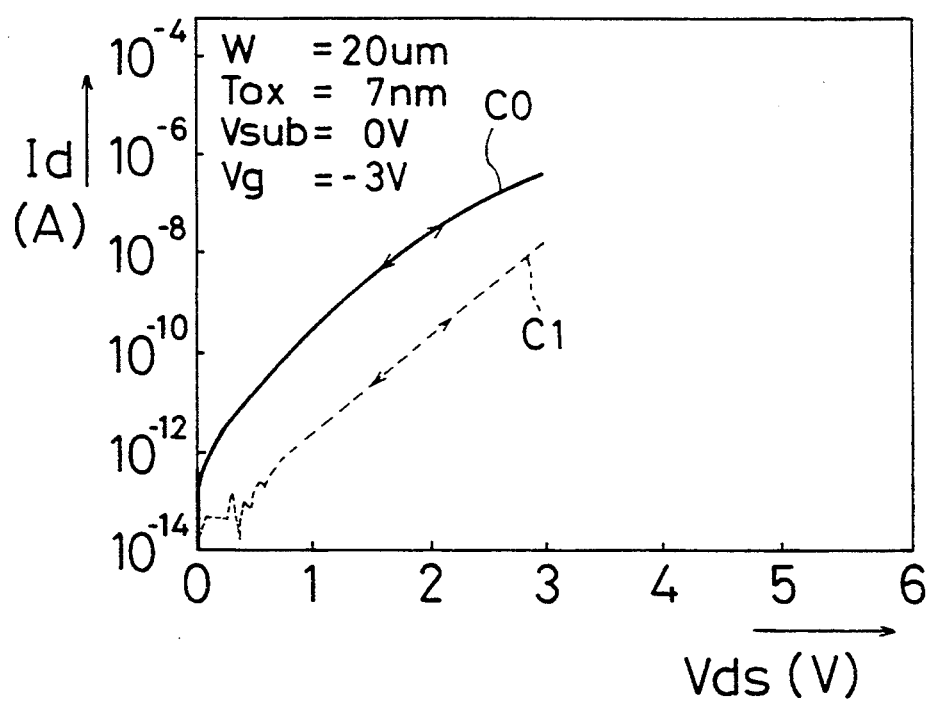
FIG. 13 is a characteristic diagram showing current-voltage characteristics in a READ operation (2).

FIG. 13 shows current-voltage characteristics when the gate and substrate voltages Vg and Vsub are set to −3 V and 0 V, respectively. In the Figure, the abscissa indicates the drain voltage Vds, whereas the ordinate indicates the drain current Id. The drain to substrate voltage Vds is swept from 0 V to 3 V, and vice versa. "0" and "1" states are individually held.

5) "0" WRITE Operation (ERASE Operation) (1)

Figure 14A:
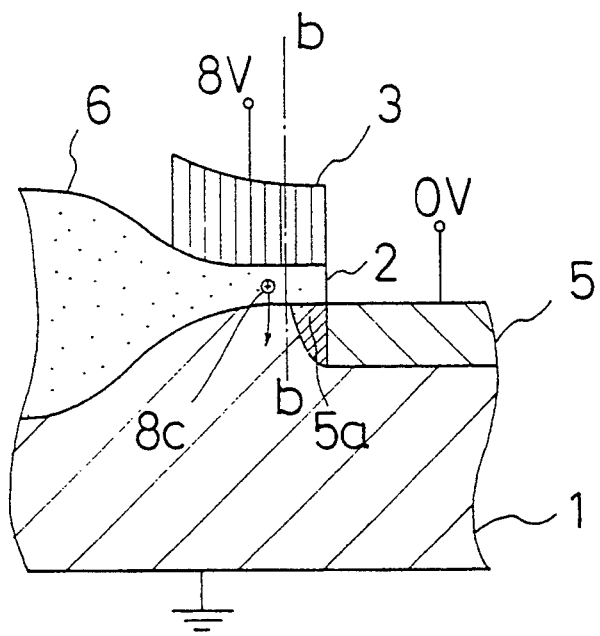
FIG. 14 (a and b) shows diagrams of a "0" WRITE operation (1) in the first embodiment.
Figure 14B:
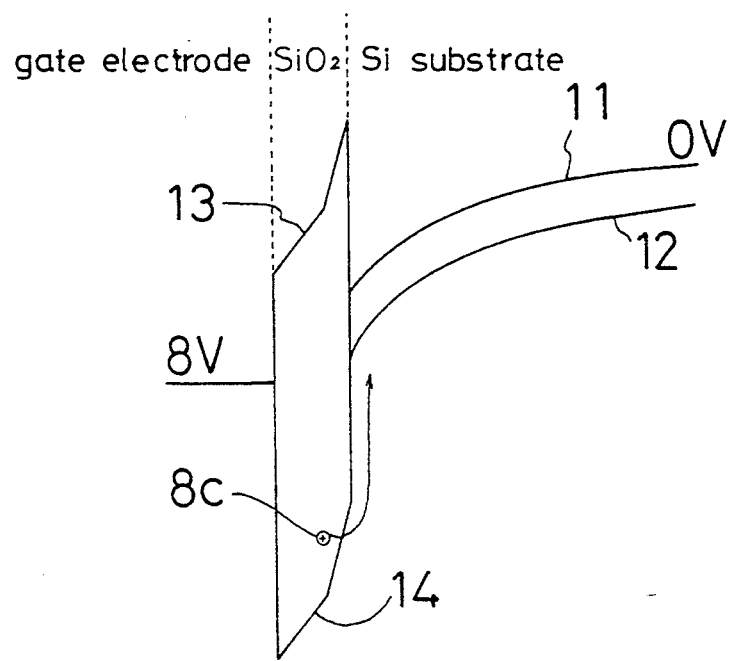

FIG. 14a is a cross-sectional view of a memory cell, and FIG. 14b is an energy band picture taken along line b—b in FIG. 14a.

When the gate voltage Vg is set to a voltage not less than 8 V, the substrate voltage Vsub, to 0 V, and the drain voltage Vds, to 0 V, a high electric field is imposed to the gate oxide layer 2 from the gate electrode 3 in the direction of the substrate 1, as shown in FIG. 14b. As a result, the hole 8c, which has been trapped, is detrapped. Then, the memory cell returns to the state of "0" (initial state).

Figure 15:
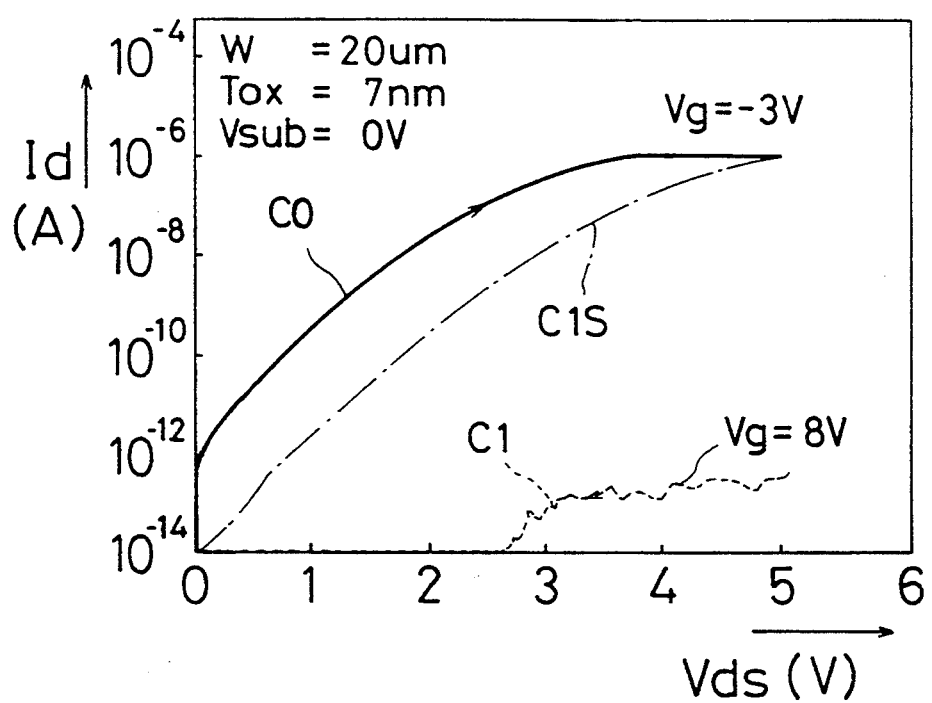
FIG. 15 is a characteristic diagram showing current-voltage characteristics in a "0" WRITE operation (1).

FIG. 15 shows current-voltage characteristics in the above described "0" WRITE operation. In the Figure, the abscissa indicates the drain to substrate voltage Vds, whereas the ordinate indicates the drain current Id. The substrate voltage Vsub is set to 0 V. As shown by broken line in FIG. 15, setting the gate voltage Vg of the memory cell in the state of "1" to 8 V, the drain to substrate voltage Vds is swept from 5 V to 0 V. Subsequently, as shown by solid line of FIG. 15, setting the gate voltage Vg to −3 V, the drain to substrate voltage Vds is swept from 0 V to 5 V. Line C1s (an alternate long and short dash line) in FIG. 15 indicates characteristics when the drain to substrate voltage Vds is swept from 0 V to 5 V, with the gate voltage Vg of the memory cell in the state of "1" set to −3 V. After the drain to substrate voltage Vds is swept from 5 V to 0 V when the gate voltage Vg is set to 8 V, the state transition from the state of "1" to the state of "0" takes place. By the above operation, the ERASE means of the fifth or sixth solving means is constructed.

As seen from FIG. 15, a "0" WRITE operation is executed by setting the gate voltage Vg to 8 V, and by sweeping the drain to substrate voltage Vds from 5 V to 0 V. However, it is also possible to execute a "0" WRITE operation by merely setting the drain to substrate voltage Vds and the gate voltage Vg to 0 V and 8 V respectively.

6) "0" WRITE Operation (ERASE Operation) (2)

Figure 16A:
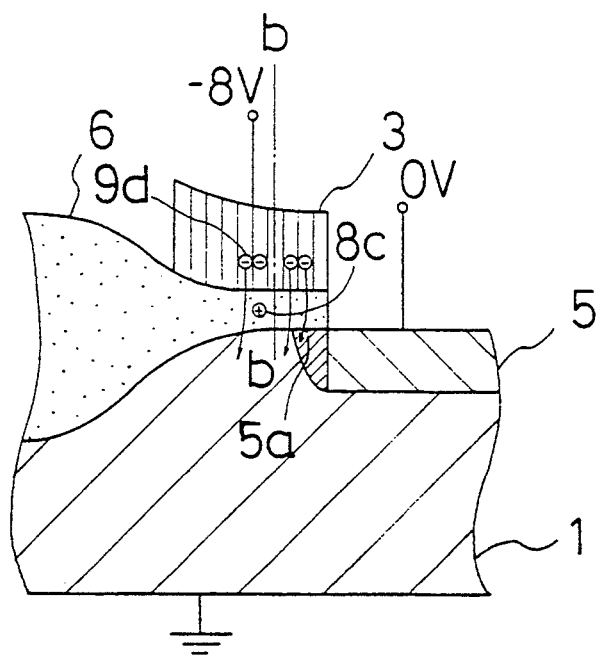
FIG. 16 (a and b) shows diagrams of a "0" WRITE operation (2) in the first embodiment.
Figure 16B:
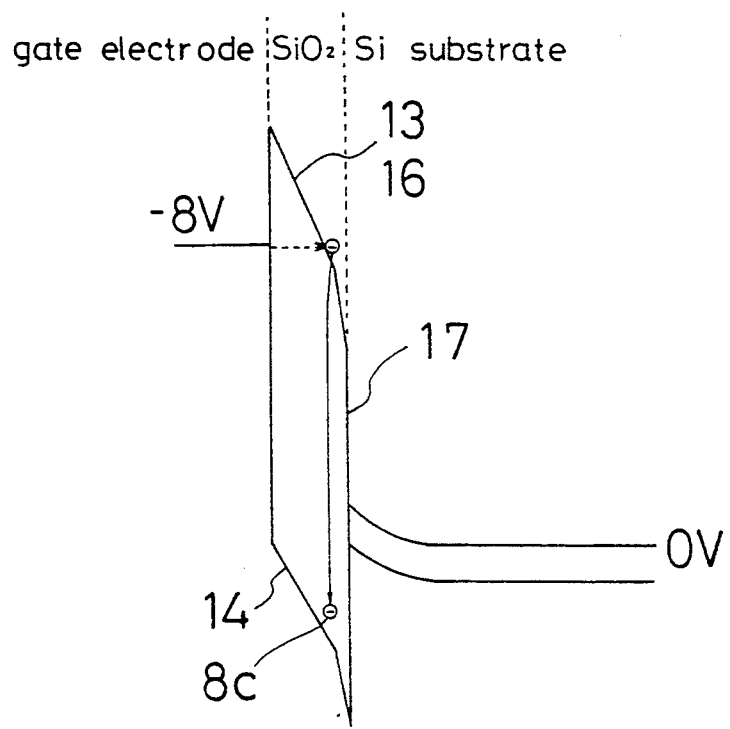

FIG. 16a depicts a cross-sectional view of a memory cell during a "0" WRITE (2) operation being carried out. FIG. 16b is an energy band picture taken along line b—b in FIG. 16a.

A characteristic diagram showing voltage-current characteristics for this operation is omitted. When the gate, substrate and drain voltages Vg, Vsub and Vds are set to a voltage not less than −8 V, 0 V and 0 V, respectively, a high electric field is imposed to the gate oxide layer 2 from the substrate 1 in the direction of the gate electrode 3, as shown in FIG. 16b. The recombination of the electron 9d generated by FN (Fowler-Nordhelm) current and the trapped hole 8c is made, so that the hole 8c trapped in the gate oxide layer 2 disappears. Then, the memory cell returns to the state of "0" (initial state). By the above voltage application operation, the ERASE means of the seventh or eighth solving means is constructed.

Further, when an n-type Si substrate and a p-type drain are used, the same memory characteristics can be obtained. However, the polarity of voltage and the direction of the electric field should be reversed. In addition thereto, by trapping electrons in the conduction band of the gate oxide layer, a "1" WRITE operation can be executed.

2. Circuit Operations

Next, the circuit operations of an integrated circuit comprising the integration of the above described memory cells will be described. An integrated circuit capable of executing only READ operations per cell is a ROM. If it can perform a "1" WRITE operation per cell, it is either a PROM or an EEPROM. If it can execute a "0" WRITE operation per cell, it is a RAM.

Hereinafter, an example of a 4-bit integrated circuit, which employs a semiconductor memory device that uses a p-type Si substrate, an n-type drain and a gate oxide layer of $SiO_2$, is taken for purposes of description. A memory cell W represents a cell that is to be selected. A memory cell X represents a non-selective cell and is on the same word line as the memory cell W. A memory cell Y represents a non-selective cell and is on the same bit line as the memory cell W. A memory cell Z represents a non-selective cell and is on different word and bit lines from the memory cell W.

1) "1" WRITE Circuit Operation

Figure 17A:
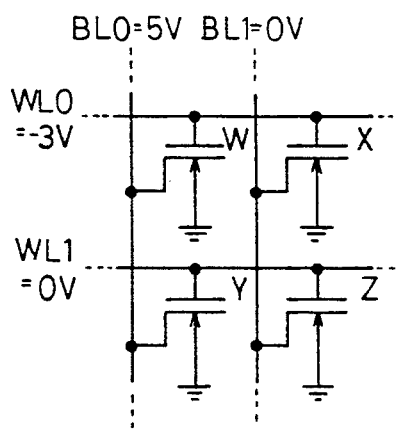
FIG. 17 (a, b, c and d) shows diagrams of a "1" WRITE circuit operation in the first embodiment.
Figure 17B:
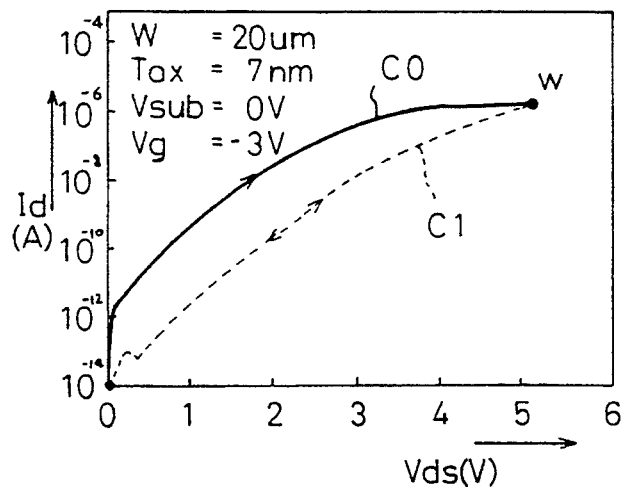

FIG. 17a is a circuit diagram of a memory cell array in accordance with the first embodiment of the invention. FIGS. 17 (b, c and d) are characteristic diagrams showing respective operating characteristics in the memory cells W, X, Y and Z, when the memory cell W is selectively written into the state of "1".

In the integrated circuit of the semiconductor memory device with the net-like arrangement of word lines WLn and bit lines BLn, as shown in FIG. 17a, a "1" WRITE operation (2) described above is used so that the memory cell W is exclusively selected among the others, and is written into the state of "1". The selective word line voltage Vkcw of $-3$ V is applied to a word line WL0; the non-selective word line voltage Vknw of 0 V, to a word line WL1; the selective bit line voltage Vkcb of 5 V, to a bit line BL0; and the non-selective bit line voltage Vknb of 0 V, to a bit line BL1. In other words, two set voltage values are given for the word lines, namely the selective word line voltage Vkcw and the non-selective word line voltage Vknw. Similarly, two set voltage values are given for the bit lines, namely the selective bit line voltage Vkcb and the non-selective bit line voltage Vknb. These set voltage values are set according to: $Vkcw < Vknw$ and $Vknb < Vkcb$. The memory cell W transfers to a state w in FIG. 17b (i.e., a "1" WRITE operation (2)). By this operation, the selective WRITE function of the WRITE means of the tenth solving means is constructed.

Figure 17C:
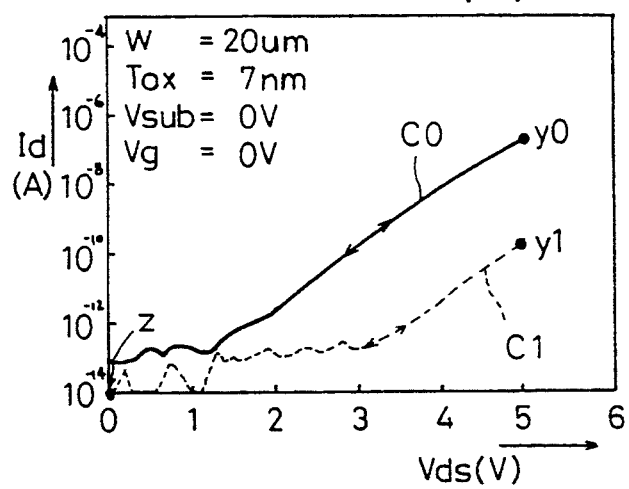
Figure 17B:
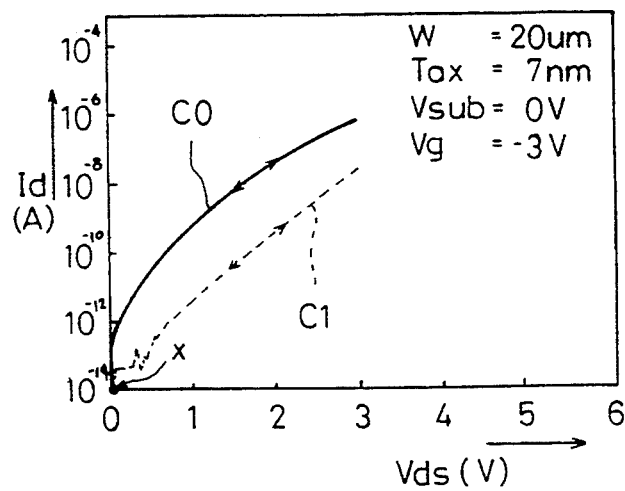

At this point in time, the memory cell X is in a state x as shown in FIG. 17d. Since the drain to substrate voltage Vds is 0 V, this will cause no band-to-band tunneling phenomenon. As a result, no "1" WRITE operations are made. Furthermore, no detrapping occurs, since the gate voltage Vg is $-3$ V. Further, no FN current occurs, so that no "0" WRITE operations are made, either. The memory cell Y, on the other hand, is in states y0 and y1 as shown in FIG. 17c, which corresponds to a READ operation (1). Neither the existing state "1" nor state "0" thereof varies. The memory cell Z is in a state z as shown in FIG. 17c. Since $Vds = Vg = Vsub = 0$ V, neither the existing "1" state nor "0" state thereof varies.

There is not the order of preference in setting respective voltages for the word and bit lines WL and BL. The voltages for both lines WL and BL may be set at the same.

In the foregoing description, only a single memory cell (namely the memory cell W) is written into a "1" state. It is however possible for two or more memory cells to be written into a "1" state. For example, a group of the memory cells W and X, a group of the memory cells W and Y, or a group of the memory cells W, X, Y and Z may be written into a "1" state at the same time.

For an n-type substrate, the same operation as the above can be obtained by setting the voltage values according to: $Vkcw > Vknw$ and $Vknb > Vkcb$.

2) READ Circuit Operation (1)

A READ Operation (1) used for selecting only the memory cell w to read from it will be illustrated.

Figure 18A:
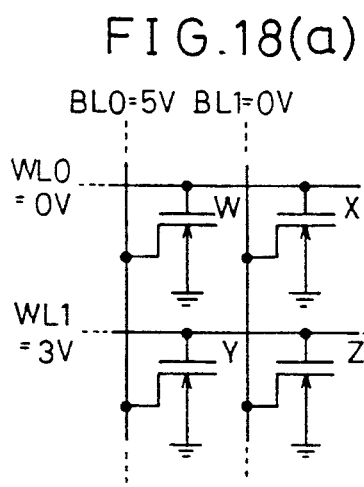
FIG. 18 (a, b, c and d) shows diagrams of a READ circuit operation (1) in the first embodiment.

FIG. 18a shows respective voltage application states for the word lines WL0 and WL1 and the bit lines BL0 and BL1, in the same integrated circuit as the one in FIG. 17a. FIG. 18 (b, c and d) shows respective operating characteristics of the memory cells W, X, Y and Z when the memory cell W is under a selective READ operation (1).

As seen from FIG. 18a, the selective word line voltage Vycw of 0 V is applied to the word line WL0; the non-selective word line voltage Vynw of 3 V, to the word line WL1; the selective bit line voltage Vycb of 5 V, to the bit line BL0; and the non-selective bit line voltage Vynb of 0 V, to the bit line BL1. In other words, two set voltage values are given for the word lines WL0 and WL1, namely the selective word voltage line Vycw and the non-selective word line voltage Vynw, while two setting voltage values are given for the bit lines BL0 and BL1, namely the selective bit line voltage Vycb and the non-selective bit line voltage Vynb. These set voltage values are determined according to: $Vycw < Vynw$ and $Vynb < Vycb$.

Figure 18B:
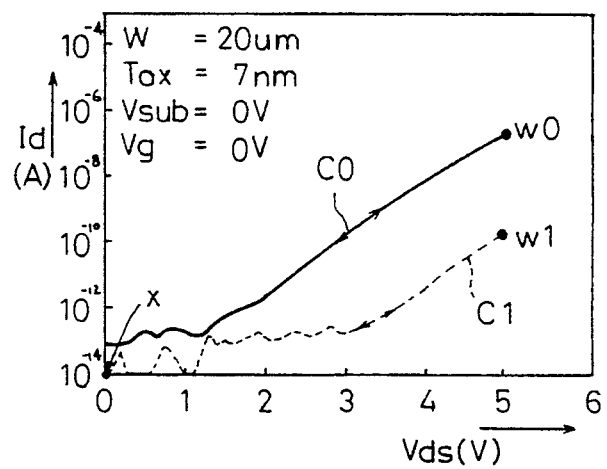
Figure 18C:
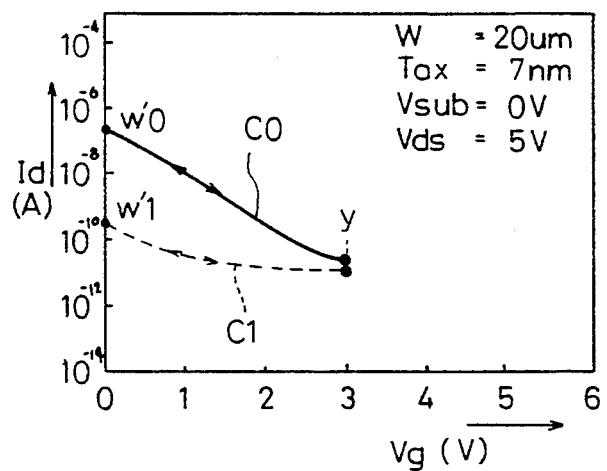
Figure 18D:
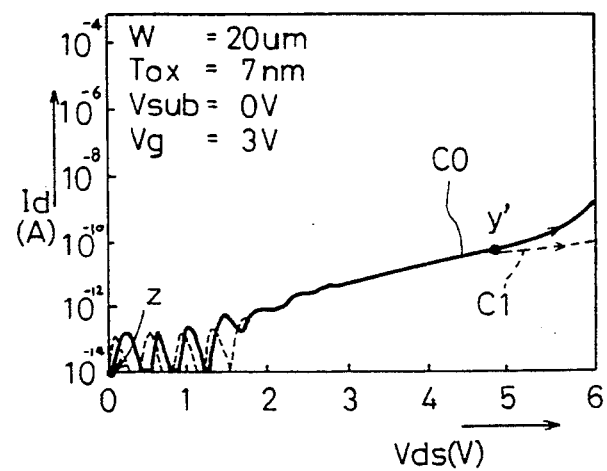

At this point in time, the memory cell transfers to states w0 and w1 as shown in FIG. 18b or to states w'0 and w'1 as shown in FIG. 18c (the above described READ operation (1)). The memory cell X, on the other hand, is in a state x as shown in FIG. 18b. Neither the existing state "1" nor state "0" thereof varies, since $Vds = Vg = Vsub = 0$ V. The memory cell Y is in a state y as shown in FIG. 18c or in a state y' as shown in FIG. 18d. The band-to-band tunneling phenomenon hardly occurs, since $Vds - Vg = 2$ V. Thus, the drain current is smaller than the read current at the w0 state by 3 or more digits so that it is possible to identify the state of the memory cell W. In addition, no "1" WRITE operations are made. Since the gate voltage Vg is 3 V, this causes no detrapping phenomenon. Further, no "0" WRITE operations are made, either, since there flows no FN current. The memory cell Z is in a state z in FIG. 18d. Since the drain to substrate voltage $Vds = 0$ V, there occurs no band-to-band tunneling phenomenon, resulting in no "1" WRITE operations being made. Furthermore, since the gate voltage $Vg = 3$ V, there occurs no detrapping phenomenon. No "0" WRITE operations are made, since no FN current flows. By the above operation, the selective READ function of the READ means of the eleventh solving means is constructed.

There is not the order of preference in setting respective voltages for the word and bit lines WL and BL, and it is also possible to set all the voltages at the same time, although it is preferable to start with the word lines for the decrease of power consumption.

According to the foregoing description, only a single memory cell (namely, the memory cell W) is accessed. However, two or more memory cells may be accessed at the same time, provided that they are connected to a common word line. The memory cells W and X may be read out at the same time, for instance.

For an n-type substrate, the same operation as the above can be obtained by setting respective voltages according to: $Vycw > Vynw$ and $Vynb > Vycb$.

3) READ Circuit Operation (2)

A READ Operation (2), used for selecting only the memory cell w to read from it, will be illustrated.

Figure 19A:
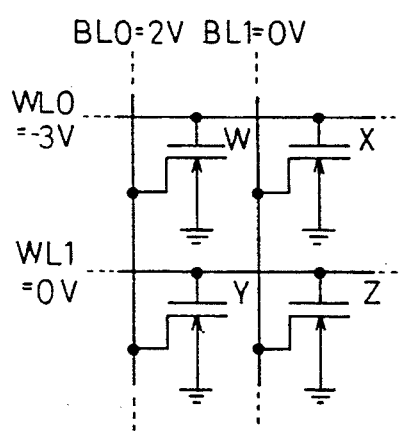
FIG. 19 (a, b and c) shows diagrams of a READ circuit operation (2) in the first embodiment.

FIG. 19a shows individual voltage application states for the word lines WL0 and WL1 and the bit lines BL0 and BL1, in the same integrated circuit as the one in FIG. 17a. FIG. 19 (b and c) shows operating characteristics of the memory cells W, X, Y and Z when the memory cell W is under a selective READ operation (2).

As seen from FIG. 19a, the voltage of −3 V is applied to the word line WL0; the voltage of 0 V, to the word line WL1; the voltage of 2 V, to the bit line BL0; and the voltage of 0 V, to the bit line BL1. In other words, like the foregoing READ circuit operation (1), two set voltage values are given for the word lines WL0 and WL1, namely the selective word line voltage Vycw and the non-selective word line voltage Vynw, while two set voltage values are given for the bit lines BL0 and BL1, namely the selective bit line voltage Vycb and the non-selective bit line voltage Vynb. These are set according to: Vycw<Vynw and Vynb<Vycb. The memory cell W transfers to states w0 and w1, which is a READ operation (2).

Figure 19B:
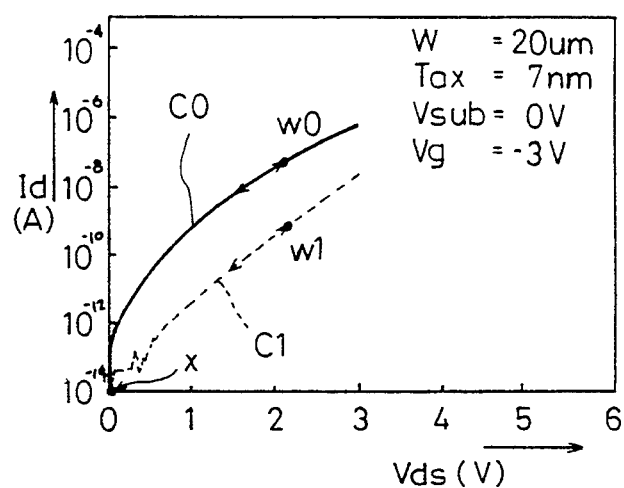
Figure 19C:
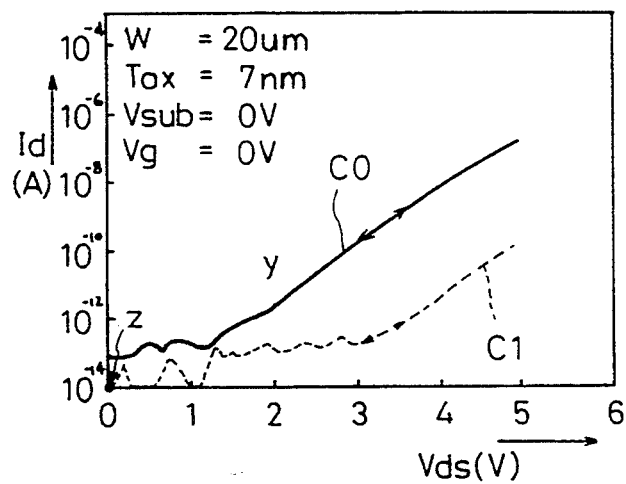

At this point in time, the memory cell X is in a state x as shown in FIG. 19b. Since Vds=0 V, there occurs no band-to-band tunneling phenomenon. Accordingly, no "1" WRITE operations are executed. Further, there occurs no detrapping phenomenon, since Vg=−3 V. No FN current flows, so that no "0" WRITE operations are executed. The memory cell Y is in a state y as shown in FIG. 19c. Since Vds−Vg=2 V, there occurs no band-to-band tunneling. The drain current is smaller than the read current at the state w0 by four or more digits. Accordingly, it is possible to identify the state of the memory cell W. In addition, no "1" WRITE operations are executed. Since the gate voltage Vg is 0 V, this causes no detrapping phenomenon. Since there occurs no FN current, no "0" WRITE operations are executed, either. Further, the memory cell Z is in a state z in FIG. 19c. Since Vds=Vg=Vsub=0 V, neither the existing "1" state nor "0" state thereof varies.

There is not the order of preference in setting voltages for the word and bit lines WL and BL, and it is also possible to set all the voltages at the same time, although it is preferable to start with the word lines for the decrease of power consumption.

According to the foregoing description, only a single memory cell (namely the memory cell W) is accessed. However, two or more memory cells may be accessed at the same time, provided that they share a common word line. The memory cells W and X may be accessed together, for instance.

4) "0" WRITE (ERASE) Circuit Operation

Figure 20A:
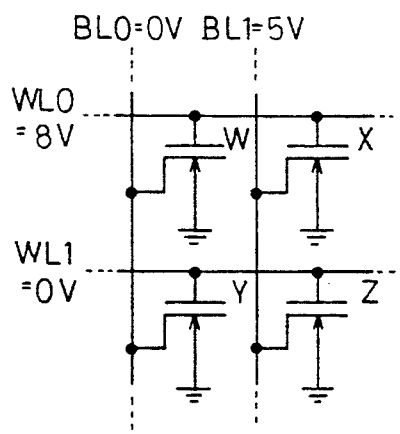
FIG. 20 (a, b, c and d) shows diagrams of a "0" WRITE circuit operation in the first embodiment.

A "0" WRITE operation, used for selecting only the memory cell W to write data into it, will be described. FIG. 20a shows individual voltage application states for the word lines WL0 and WL1 and the bit lines BL0 and BL1, in the same integrated circuit as the one in FIG. 17a. FIG. 19 (b and c) shows operating characteristics of the memory cells W, X, Y and Z when the memory cell W is under a selective "0" WRITE (ERASE) operation.

Figure 20B:
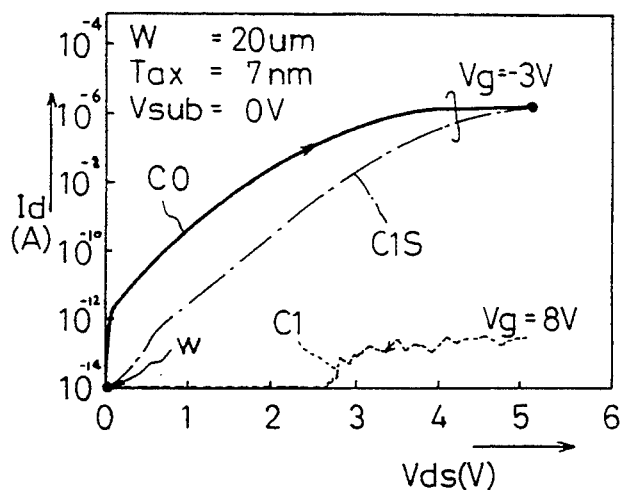
Figure 20C:
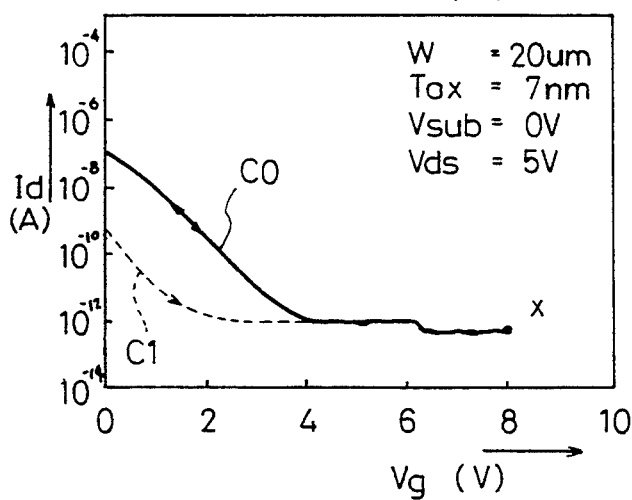
Figure 20D:
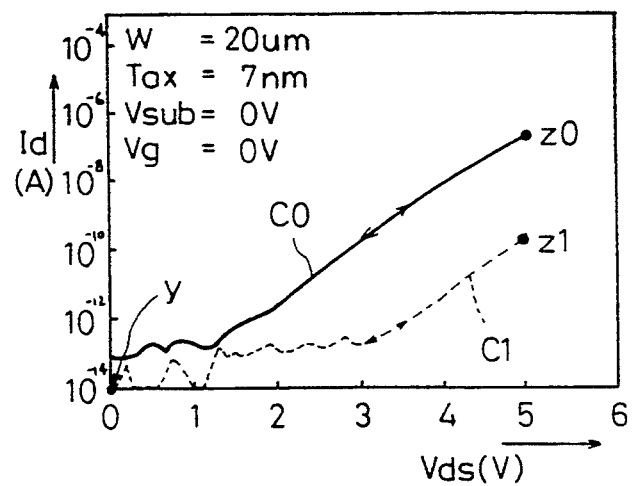

The selective word line voltage Vscw of 8 V is applied to the word line WL0; the non-selective word line voltage Vsnw of 0 V, to the word line WL1; the selective bit line voltage Vscb of 0 V, to the bit line BL0; and the non-selective bit line voltage Vsnb of 5 V, to the bit line BL1. In other words, two set voltage values are given for the word lines, namely the selective word line voltage Vscw and the non-selective word line voltage Vsnw, and two set voltage values are given for the bit lines, namely the selective bit line voltage Vscb and the non-selective bit line voltage Vsnb. These values are set according to: Vscw>Vsnw and Vsnb>Vscb. As shown in FIG. 20b, the memory cell W is in a state w where the drain to substrate voltage Vds reaches 0 V from the positive direction, with the Vg=8 V, which is a "0" WRITE operation. The memory cell X is in a state x as shown in FIG. 20c. Since Vds−Vg=−3 V, there occurs no band-to-band tunneling, which means that no "1" WRITE operations are made with respect to the memory cell X. There occurs no detrapping phenomenon. Besides, no FN current flows, so that no "0" WRITE operations are made, either. At this stage, in conventional semiconductor memory devices having therein a source region, channel current occurs, which results either in soft write operation or in the increase of power consumption. In accordance with the present invention, there occur no soft write operations, and the increase of power consumption can be avoided. The memory cell Y is in a state y as shown in FIG. 20d. Neither the existing state "1" nor state of "0" thereof varies, since Vds=Vg=Vsub=0 V. The memory cell Z Is in states z0 and z1, which corresponds to a READ operation (1). Neither the existing state "1" nor state "0" thereof varies. By this operation, the selective ERASE function of the ERASE means of the fourteenth solving means is constructed.

With regard to a "0" WRITE (ERASE) circuit operation, the voltages for the bit lines must be set prior to setting those of the word lines, and the reset of the voltages to a former state must be done, starting with the word lines.

In the above description, only a single memory cell (namely the memory cell W) is shifted into "0" state by means of a "0" WRITE operation. However, two or more memory cells may be shifted into "0" state at the same time by means of a "0" WRITE operation. For example, a group of the memory cells W and X, a group of the memory cells W and Y, or a group of the memory cells W, X, Y and Z may be shifted into a "0" state at the same time. However, it is not possible to shift only the memory cells W and Z to a "0" state at the same time while maintaining the states of the memory cells X and Y.

For an n-type substrate, with Vscw<Vsnw and Vsnb>Vscb, the contents of a memory can be erased selectively, as in the above.

In each description regarding the above circuit operations, although a 4-bit memory cell array with two word lines and two bit lines is used, a memory cell array having at least one word line and at least one bit line may be available.

5) Circuit Operation Timing Chart

Reference is now made to FIG. 21 showing a timing chart. The timing chart describes circuit operations in which the foregoing basic operations including "1" WRITE, "0" WRITE and "0" WRITE (ERASE) operations are successively executed. In the timing chart, the voltages of all of the word and bit lines at a data hold state are 0 V.

FIG. 21a shows timing with regard to a "1" WRITE operation. By shifting the voltages of the selective word and bit lines WL0 and BL0 to −3 V and 5 V respectively from their respective data hold states, and by maintaining the voltages of the others at the same levels as those at their data hold states (i.e., as described above, by setting two values for the word lines, −3 V and 0 V and two values for the bit lines, 0 V and 5 V), a "1" WRITE operation is executed.

FIG. 21b shows timing with regard to a "0" WRITE operation. By shifting the voltage of the non-selective bit line BL1 to 5 V from its data hold state and then by shifting the voltage of the selective word line WL0 to 8 V (that is to say, as described above, by setting two voltage values for the word lines, namely 0 V and 8 V and two voltage values for the bit lines, namely 0 V and 5 V), a "0" WRITE operation is executed.

FIG. 21c shows timing with regard to a READ (2) operation. By shifting the voltages of the selective word line WL0 and the selective bit line BL0 to −3 V and 2 V respectively from their respective data hold states (that is to say, as described above, by setting two voltage values for the word lines, namely −3 V and 0 V and by setting two voltage values for the bit lines, namely 0 V and 2 V), a READ (2) operation is executed.

In the above READ operation, the value of a current is directly read out, while it may be read out through the voltage variation of a bit line caused by pre-charging it. FIG. 21d shows timing with regard to a READ operation (2') accompanied with pre-charging, wherein the voltage of the selective bit line BL0 is pre-charged to 2 V from its data hold state, and then the voltage of the selective word line WL0 is shifted to −3 V. By using the fact that the voltage variation of the selective bit line BL0 varies between "1" and "0" states, a READ operation is executed.

According to the foregoing timing charts, a ROM can be available by using only a READ operation, a PROM by using both "1" WRITE operation and READ operation, an EEPROM by using a "0" WRITE (ERASE) operation to erase all of or part of the memory cells, a "1" WRITE operation and a READ operation, and a RAM by using a selective "0" WRITE (ERASE) operation, a "1" WRITE operation and a READ operation. As it is readily seen from the above timing charts, when using the semiconductor memory device of the invention as a ROM, no operations but READ operation is executed. In this case, the set voltages of the word lines comprise two values (i.e., −3 V and 0 V), while the set voltages of the bit lines comprise two values (i.e., 0 V and 2 V). On the other hand, when used as a PROM, a "1" WRITE operation or a READ operation is performed. In this case, the set voltages of the word lines comprise two values (i.e., −3 V and 0 V), while the set voltages of the bit lines comprise three values (i.e., 0 V, 2 V and 5 V). By this operation, the selective WRITE and READ functions of the WRITE and READ means of the twelfth solving means are constructed.

When the present semiconductor memory device is used as an EEPROM or a RAM, a "1" WRITE, a "0" WRITE or a READ operation is executed. Therefore, the set voltages of the word lines comprise three values (i.e., −3 V, 0 V and 8 V), while the set voltages of the bit lines comprise three values (i.e., 0 V, 2 V and 5 V).

Next, the circuit operations of a READ operation (1) will be described. In a READ circuit operation (1), the ratio of a current in a "0" state to another in a "1" state is great, which is useful for READ operations. FIG. 22a shows a timing chart with regard to a READ circuit operation (1). The set voltages of the word lines comprise two values, 0 V and 3 V, while the set voltages of the bit lines comprise two values, 0 V and 5 V. In a READ circuit operation (1), when the semiconductor memory device of the invention is used as a ROM, the set voltages of the word lines comprise two values, 0 V and 3 V, while the set voltages of the bit lines comprise two values, 0 V and 5 V. Further, when used as a PROM, the set voltages of the word lines comprise three values, −3 V, 0 V and 3 V, while the set voltages of the bit lines comprise two values, 0 V and 5 V. By this operation, the selective WRITE, READ and ERASE functions of the WRITE, READ and ERASE means of the thirteenth solving means are constructed.

Furthermore, when the present semiconductor memory device is used as an EEPROM or a RAM, the set voltages of the word lines comprise four values (i.e., −3 V, 0 V, 3 V and 8 V), while the set voltages of the bit lines comprise two values (i.e., 0 V and 5 V). By this operation, the selective WRITE, READ and ERASE functions of the WRITE, READ and ERASE means of the sixteenth solving means are constructed.

In a READ operation, the value of a current is directly read out, while it may be read out through the voltage variation of a bit line caused by pre-charging it. FIG. 22d shows a timing chart with pre-charging.

During pre-charging, the voltage of 3 V is applied to the gate electrode, and the voltage of 5 V to the drain electrode, however, for a memory cell with a conventional MOS transistor, it becomes an ON state so that it is not possible to pre-charge the bit line. Against this, in the present invention, there are provided no source electrodes, so that no current flows into the memory cell. It is therefore possible to pre-charge the bit line.

The foregoing timing of the circuit operation is also available even in a 4 or more bit memory cell array so that only a memory cell in a unit of one bit can be selected to execute a selective write or read operation.

Although the first embodiment illustrates one example in which a WRITE or READ operation is performed by selecting only a single memory cell in a unit of bit unit, it is possible to shift all or a part of the memory cells into a "1" or "0" state at the same time by means of a WRITE operation. Accordingly, WRITE operations can be efficiently performed.

According to the first embodiment, a 1-bit memory cell comprises three terminals, namely the semiconductor substrate 1, the drain region 5 and the gate electrode 8. Although the memory cell has a simple structure that it incorporates therein no source regions, the gate oxide layer 2 between the drain region 5 and the gate electrode 3 can be used as a nonvolatile memory. Accordingly, a bit-by-bit WRITE, READ or ERASE operation can be executed by means of simple voltage setting with respect to individual terminals. Particularly, when the memory cell is used as an EEPROM or a RAM which can execute a selective WRITE, READ or ERASE operation per bit, each memory cell is given nonvolatileness, requires no refresh operations, and needs less power. Furthermore, the applied voltage to a memory cell at its data hold state is 0 V, so that less power consumption is achieved. Since no source regions are incorporated, this eliminates the need of channels. Accordingly, the degree of integration is remarkably improved.

Figure 22:
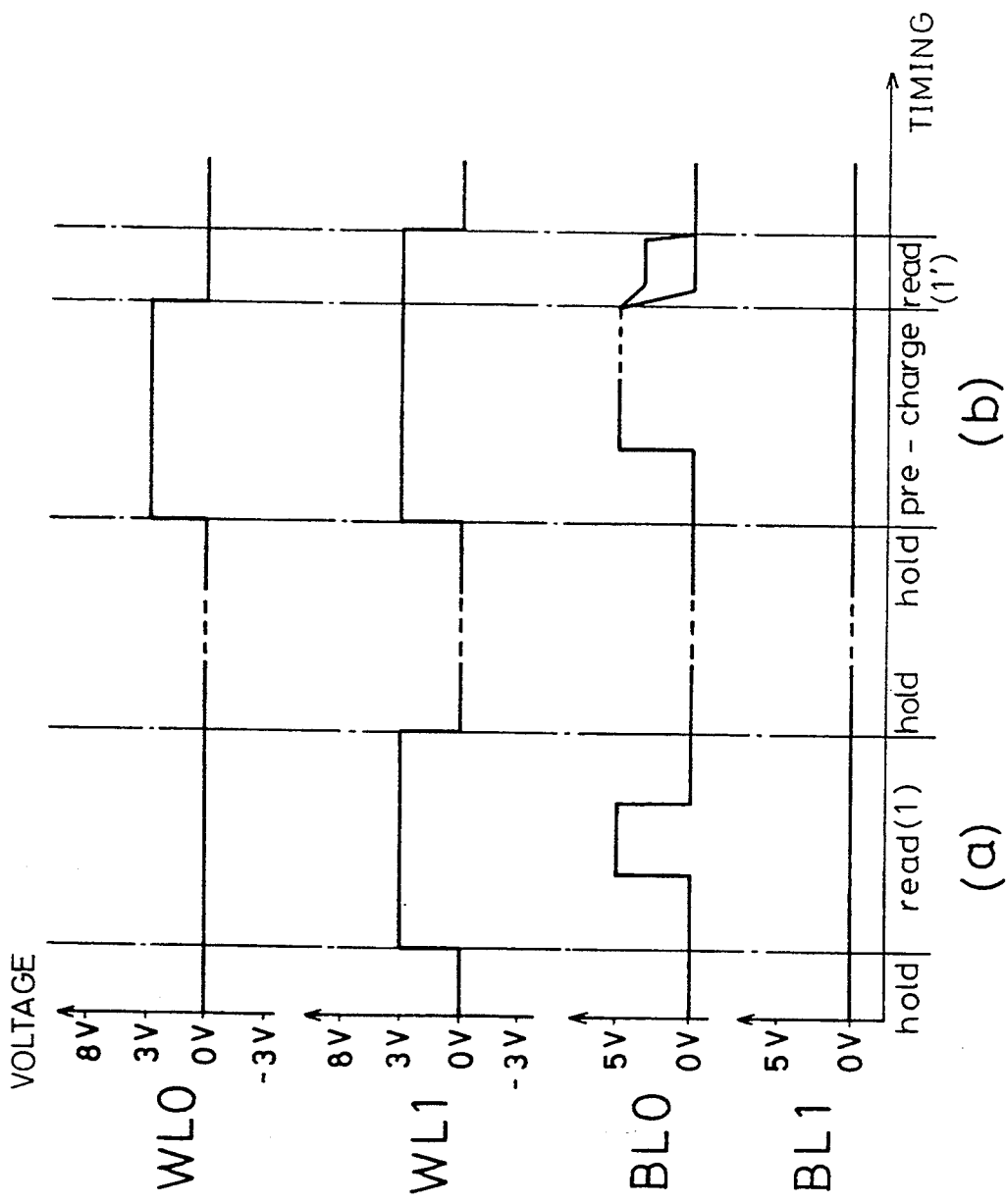
FIG. 22 is a timing chart showing a READ circuit operation (1) in the first embodiment.

According to the timing charts in FIGS. 21 and 22, each data hold state is provided just before WRITE or READ operations. It may be possible to exclude the provision of such data hold states to achieve a higher speed operation.

The foregoing embodiment has been described, on the assumption that individual memory cells in the semiconductor memory device are previously set to the state of "0". However, all of the memory cells may be preshifted to the state of "1". Alternatively, it is also possible to shift all of the memory cells to a "1" state at a starting time and then to start a memory operation. In this case, a "0" WRITE operation is done by shifting the state of the memory cell from a "1" to "0" state. In conventional semiconductor memory devices, about 80% of the memory cells do not perform neither a WRITE nor READ operation in a relatively short operation time. However, in the semiconductor memory device of the invention, the read current value in a "1" state is lower than in "0" state, so that the decrease of power consumption can be accomplished by pre-writing at the same time all of the memory cells into a "1" state, as in the ninth solving means.

SECOND EMBODIMENT

Figure 28A:
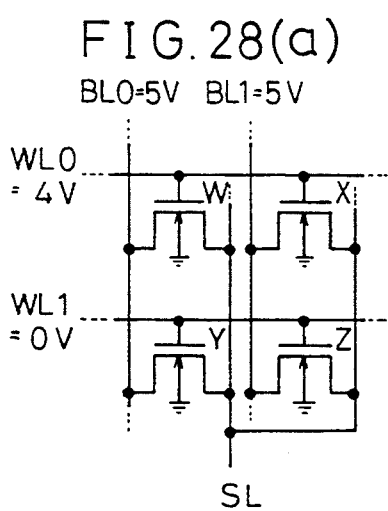
FIG. 28 (a, b, c and d) shows diagrams of a "0" WRITE circuit operation (3) in the second embodiment.

A second embodiment relating to the seventeenth to thirty-second solving means will be described. FIG. 28a depicts a cross-sectional structure of a 1-bit memory cell of a semiconductor memory device in accordance with the second embodiment. The form of the semiconductor memory device of the second embodiment is different from the first embodiment. Formed together on the surface of the semiconductor substrate 1 of a p-type (a first conductivity type) are a source region 4 of an n-type (a second conductivity type) having a doping of, such as, phosphorus, and the drain region 5 of an n-type. The gate oxide layer 2 of $SiO_2$ serving as an insulating layer is formed on the semiconductor substrate 1, overlaying partly an edge of the drain region 5 and extending to an edge of the source region 4. Formed over the gate oxide layer 2 is the gate electrode 3 of a polycrystalline silicon layer. The present 1-bit memory cell is composed of the semiconductor substrate 1, the source region 4, the drain region 5, the gate oxide layer 2 and the gate electrode 3.

The thickness of the gate oxide layer 2, Tox, the width of the gate electrode 3, W and the forming means of forming the drain region 5 are the same as the first embodiment. Although the forming state of the source region 4 is the same as that of the drain region 5, the conductivity characteristics of the drain region 5 are not necessarily the same as those of the source region 4.

Figure 23A:
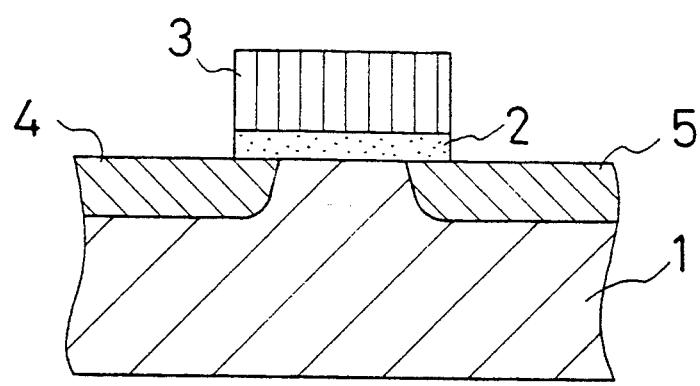
FIG. 23 (a and b) shows a cross-sectional structure of a memory cell of the semiconductor memory device in accordance with a second embodiment of the invention and circuit symbols.
Figure 23B:
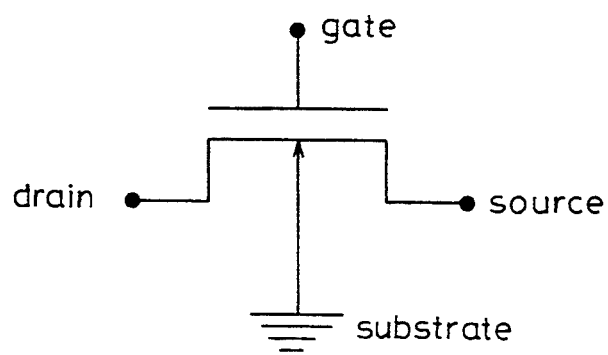
Figure 26B:
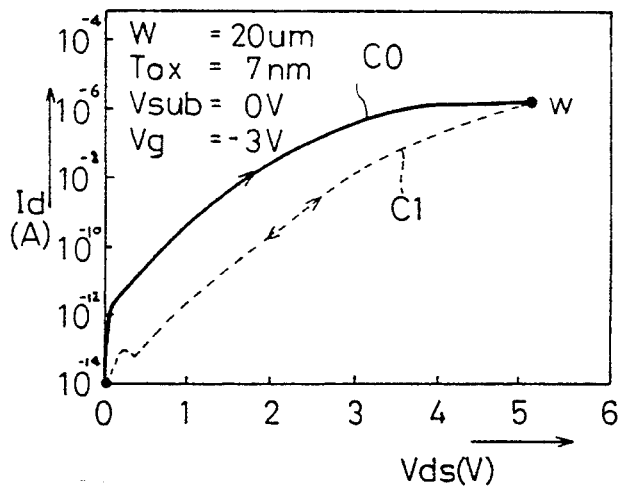
FIG. 26 (a, b, c and d) shows diagrams of a "1" WRITE circuit operation in the second embodiment.
Figure 26A:
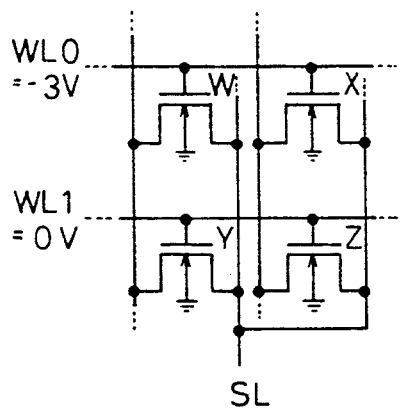
Figure 26C:
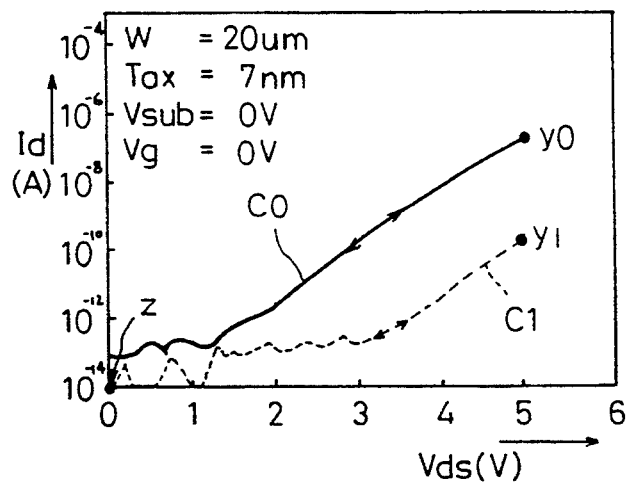
Figure 26D:
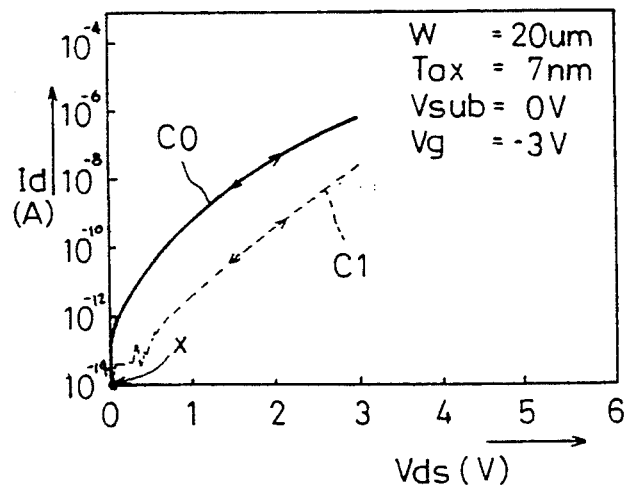

The memory cell above described is represented by symbols of a circuit diagram (FIG. 23b), which is a memory cell with four terminals. As shown in FIG. 26a, the word line is connected to the gate electrode 3, the bit line is connected to the electrode of the drain region 5, and a source line SL is shared and connected to the source region 4 of each memory cell.

An integrated circuit diagram of the semiconductor memory device is omitted, since it is the same as the one in FIG. 2 of the first embodiment except the fact that the memory cell in the second embodiment is composed of four terminals.

In the first place, the basic operations in the above memory cell of the second embodiment including WRITE, READ, ERASE operations will be described, taking an example in which the p-type semiconductor substrate 1, the n-type drain region 5, and n-type source region 4 and the gate oxide layer of $SiO_2$ are used.

1. Basic Operations

1) "1" WRITE operation (1)

This WRITE operation is basically the same as the one as shown in FIG. 3 (a, b and c) of the first embodiment, although the corresponding figures are omitted. The band-to-band tunneling phenomenon is caused by voltage application (not less than the second set voltage difference). Holes generated by band-to-band tunneling jump from the valence band 12 of the semiconductor substrate 1 to the valence band 14 of the gate oxide layer 2, so that the holes are trapped in the gate oxide layer 2. In this way, a "1" WRITE operation is done. By this operation, the WRITE means of the nineteenth solving means is constructed.

Also, in the second embodiment, it is possible to execute a WRITE operation (1) or (2) of the first embodiment.

2) READ Operation

Figure 12B:
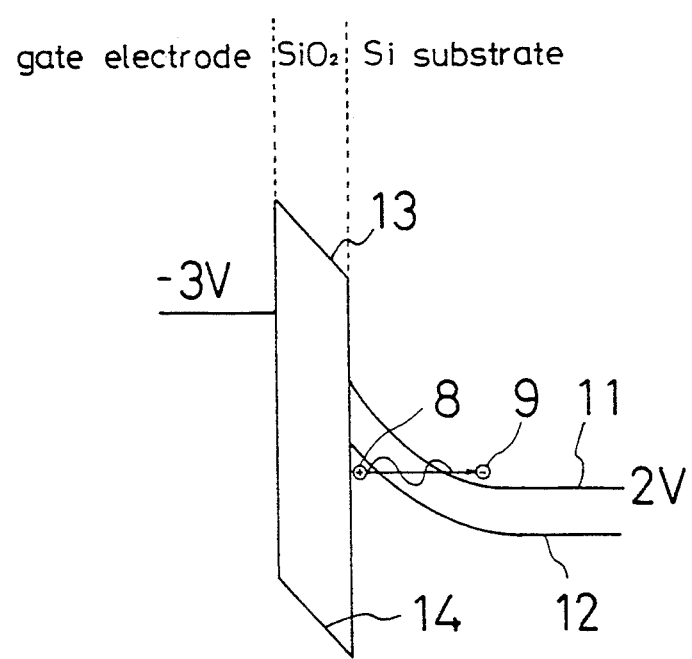

A Read operation of the second embodiment is also the same as a READ operation (2) as shown in FIGS. 12 (a and b) and 13 of the first embodiment. When holes are trapped in the gate oxide layer 2, the electric field of the gate-drain overlapped region 5a is relaxed. The resulting gate induced drain leakage current is lower than that in "0" state, when the same voltage (not more than the second set voltage difference) is applied. By utilizing this fact, the memory state is read out of the gate oxide layer 2. By this operation, the READ means of the eighteenth or twentieth solving means is constructed.

3) "0" WRITE Operation (ERASE Operation) (1)

Also, in the second embodiment, it is possible to execute an ERASE operation (1) or (2) of the first embodiment.

As shown in FIGS. 14 (a and b) and 15, a high electric field is imposed to the gate oxide layer 2 from the gate electrode 3 in the direction of the substrate 1. The hole 8c, which has been trapped, is detrapped. The memory cell returns to the state of "0" (initial state) so that a WRITE (ERASE) operation to the state of "0" is done. By this operation, the ERASE means of the twenty-first or twenty-second solving means is constructed.

4) "0" WRITE Operation (ERASE operation) (2)

As shown in FIG. 16 (a and b) described in the first embodiment, a high electric field is imposed to the gate oxide layer 2 from the substrate 1 in the direction of the gate electrode 3. The recombination of the electron 9d generated by FN (Fowler-Nordheim) current and the hole 8c trapped is made, as a result of which the hole 8c in the gate oxide layer 2 disappears. Thus, it is possible to write the memory cell into the state of "0" by means of a "0" WRITE operation (ERASE operation). By this operation, the ERASE means of the twenty-third or twenty-fourth solving means is constructed.

Further, even when an n-type S1 substrate and a p-type drain are used, the same memory characteristics are obtained, although both the polarity of voltage and the direction of the electric field as described in the foregoing description should be reversed. In addition thereto, electrons are trapped in the conduction band of the gate oxide layer, so that a "1" WRITE operation is executed, which is the same as the first embodiment.

5) "0" WRITE Operation (ERASE Operation) (3)

Figure 24:
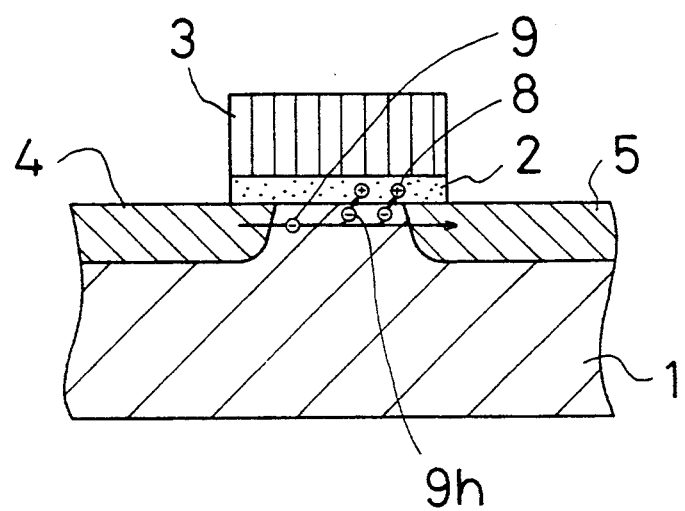
FIG. 24 is a diagram of a "0" WRITE operation (3) in the second embodiment.

Unlike the first embodiment, the source region 4 is provided in the second embodiment, allowing for an ERASE operation (3) to be carried out. As shown in FIG. 24, when the gate, substrate and drain voltages Vg, Vsub, and Vds are set to a voltage not less than 4 V, 0 V and a voltage not less than 5 V respectively, a channel current flows in the interface of the gate oxide layer 3. Then, by the fact that the drain voltage Vds is set to a voltage not less than 5 V, a high electric field is imposed in the direction of the channel. As a result, the channel current partly becomes a channel hot electron 9h. The hole 8c trapped in the gate oxide layer 2 is neutralized by the electron 9h, so that a WRITE operation, shifting the gate oxide layer 2 to a "0" state, is done (in other words, an ERASE operation is done). By this operation, the erase means of the twenty-fifth or twenty-sixth solving means is constructed.

Figure 25:
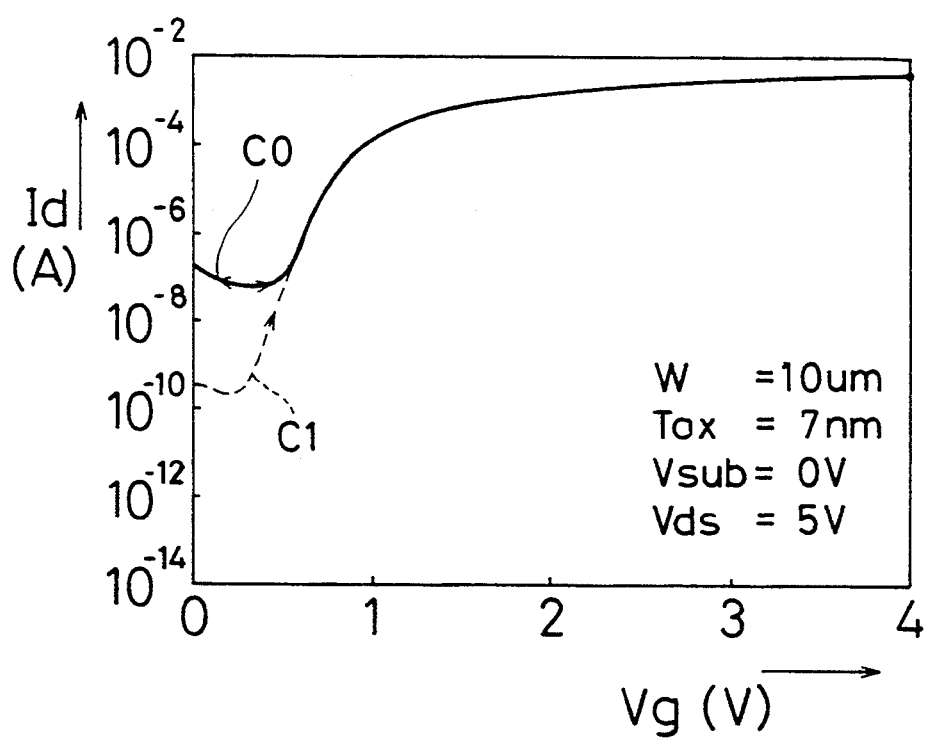
FIG. 25 is a characteristic diagram showing current-voltage characteristics in a "0" WRITE operation (3).

FIG. 25 is a characteristic diagram showing current-voltage characteristics in the foregoing "0" WRITE operation (3). In the figure, the abscissa indicates the gate voltage Vg, while the ordinate indicates the drain current Id. The drain voltage Vds of 5 V is set for the memory cell in the state of "1", as shown by broken line C1. Then the gate voltage Vg is swept from 0 V to 4 V. Thereafter, the voltage Vds is reset to 4 V, after which the gate voltage Vg is swept to 0 V to 4 V, as shown by solid line CO of FIG. 25.

2) Circuit Operations

1) "1" WRITE Circuit Operation

A "1" WRITE circuit operation of the second embodiment is the same as the one of the first embodiment. As shown in FIG. 26a, the word lines WLn are connected to the respective gate electrodes 3 of each of the memory cells X, Y and Z, and the bit lines BLn are connected to the respective drain sources 5 of each of the memory cells W, X, Y and Z so that the integrated circuit of the semiconductor memory device, which is arranged in a net-like form, is formed. The source region 4 of each of the memory cells W, X, Y and Z is connected to the common source line SL. The selective word line voltage Vkcw of −3 V is applied to the word line WL0; the non-selective word line voltage Vknw of 0 V, to the word line WL1; the selective bit line voltage Vkcb of 5 V, to the bit line BL0; and the non-selective bit line voltage Vknb of 0 V, to the bit line BL1. In other words, two set voltage values are given for the word lines, namely the selective word line voltage Vkcw and the non-selective word line voltage Vknw, and two set voltage values are given for the bit lines, namely the selective bit line voltage Vkcb and the non-selective bit line voltage Vknb. By setting these voltages according to: Vkcw<Vknw and Vknb<Vkcb, individual operating characteristics of the memory cells W, X, Y and Z as shown in FIG. 26 (b, c and d) are obtained (see the description of FIG. 17 (b, c and d) of the first embodiment). Only the memory cell W is selectively shifted to the state of "1" by means of a "1" WRITE operation (2). By this operation, the selective write function of the write means of the twenty-eighth solving means is constructed.

2) READ Circuit Operation (2)

Figure 27A:
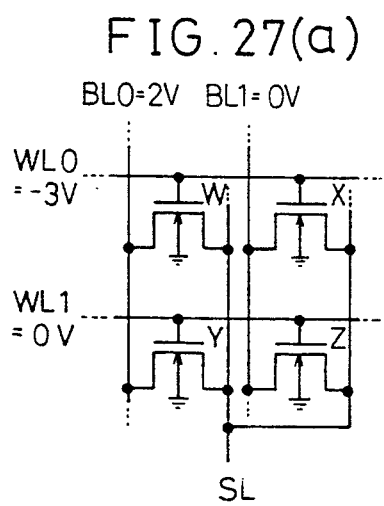
FIG. 27 (a, b and c) shows diagrams of a READ circuit operation in the second embodiment.
Figure 27B:
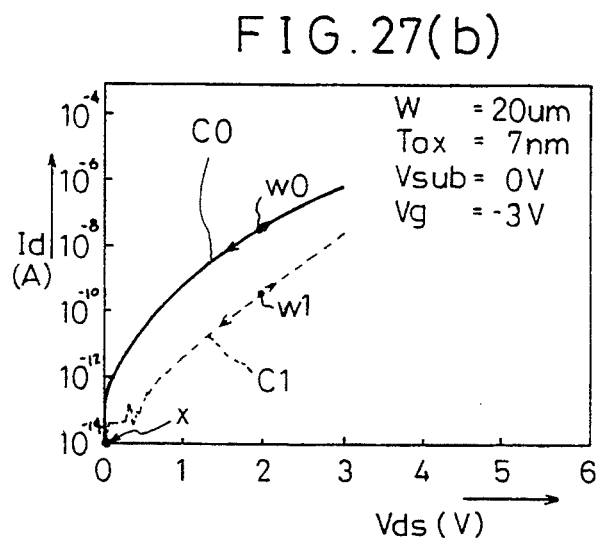
Figure 27C:
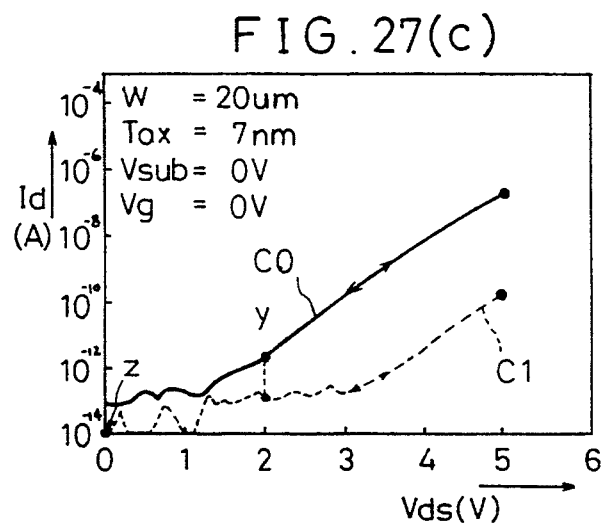

A READ circuit operation of the second embodiment is the same as a READ circuit operation (2) of the first embodiment. As seen from FIG. 27a, the voltage of −8 V is applied to the word line WL0; the voltage of 0 V, to the word line WL1; the voltage of 2 V, to the bit line BL0; and the voltage of 0 V, to the bit line BL1. In other words, like the foregoing READ circuit operation (2), two set voltage values are given for the word lines WL0 and WL1, namely the selective word line voltage Vycw and the non-selective word line voltage Vynw, and two set voltage values are given for the bit lines BL0 and BL1, namely the selective bit line voltage Vycb and the non-selective bit line voltage Vynb. By setting these set voltage values according to: Vycw<Vynw and Vynb<Vycb, individual operating characteristics are obtained, as shown in FIG. 27 (b and c), and a selective READ operation from the memory cell W is executed (see the description of FIG. 19 (a and b) of the first embodiment). By this operation, the selective READ function of the READ means of the twenty-ninth solving means is constructed.

3) "0" WRITE Circuit Operation

In the second embodiment, this operation is described by taking an example in which the semiconductor memory device is applied to an EEPROM which executes a partial ERASE operation.

Figure 28B:
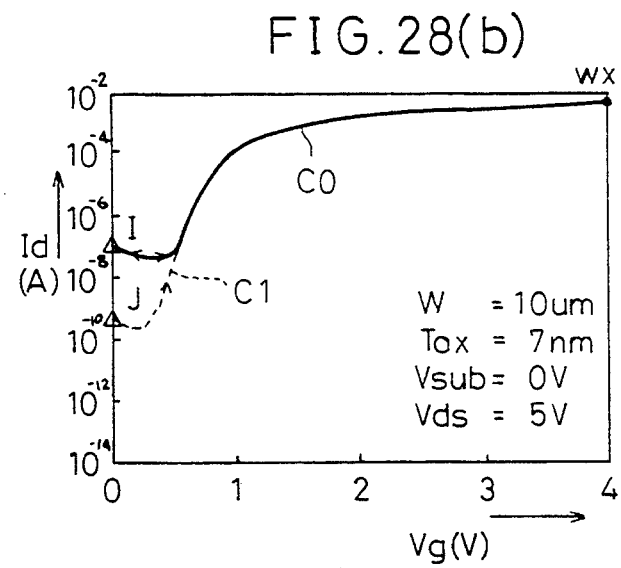
Figure 28C:
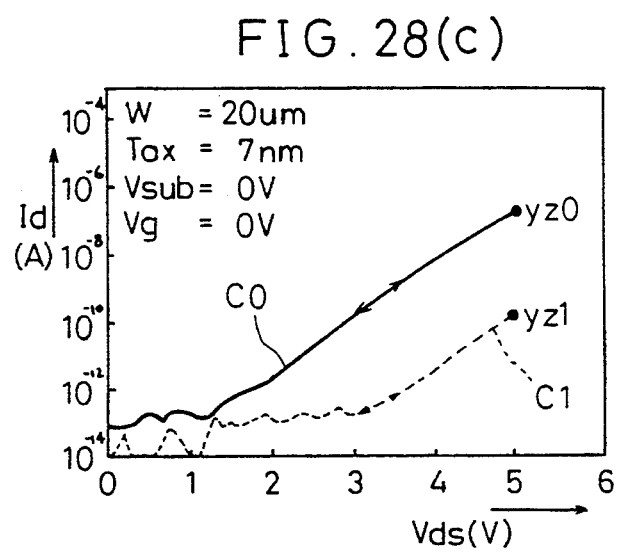
Figure 28D:
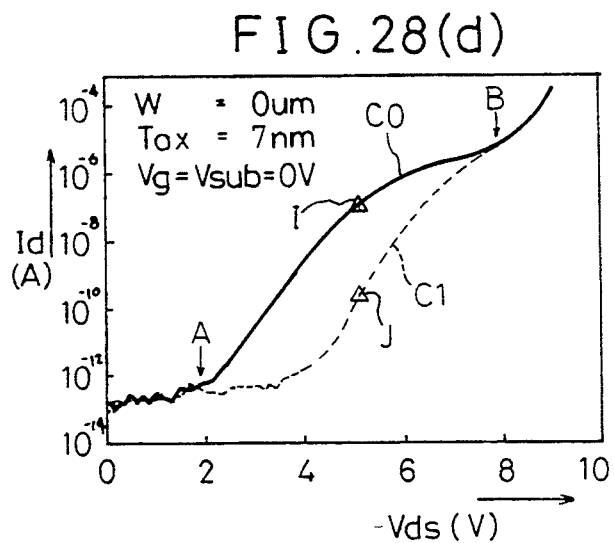
Figure 30A:
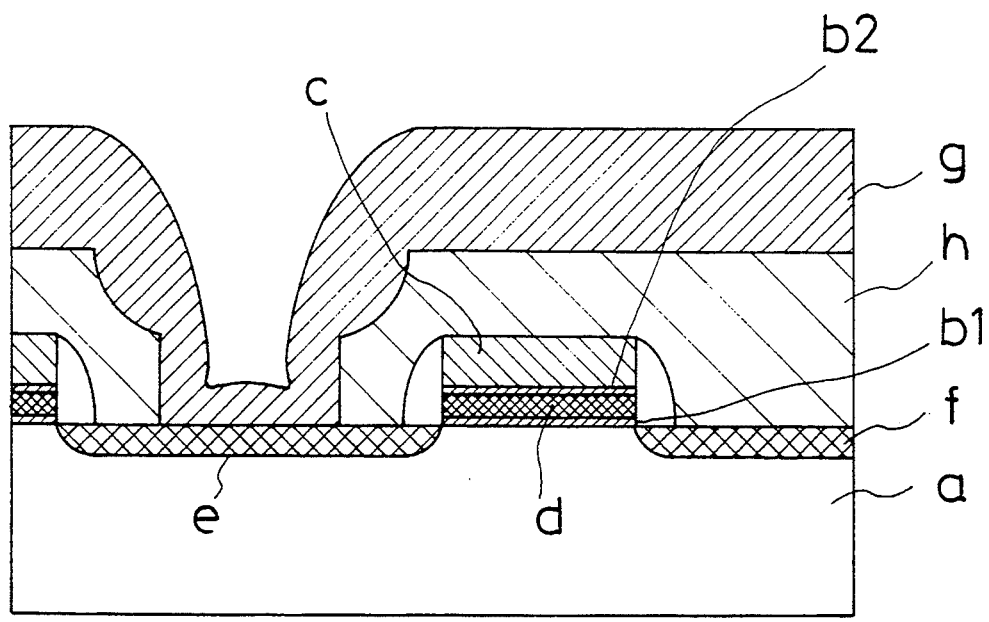
FIG. 30 (a and b) shows a cross-sectional structure and a circuit wiring structure of a conventional flash-type EEPROM.
Figure 30B:
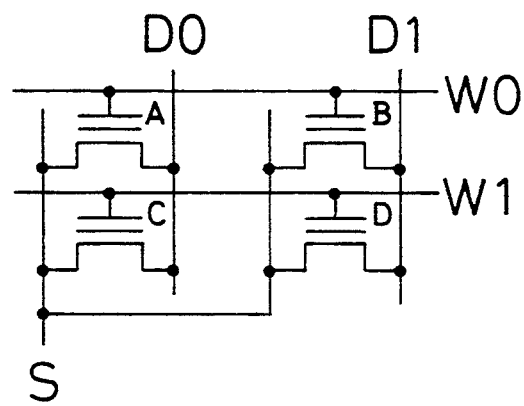
Figure 31:
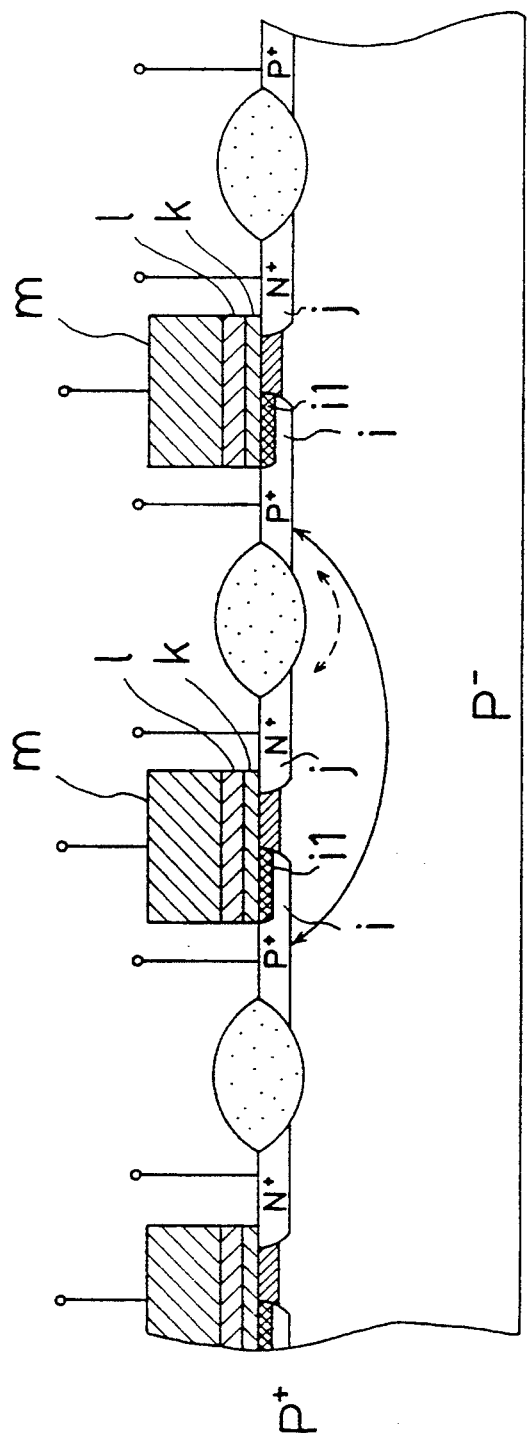
FIG. 31 shows a cross-sectional structure of a conventional semiconductor memory device with a drain-and-source structure, and interference between the regions.
Figure 32:
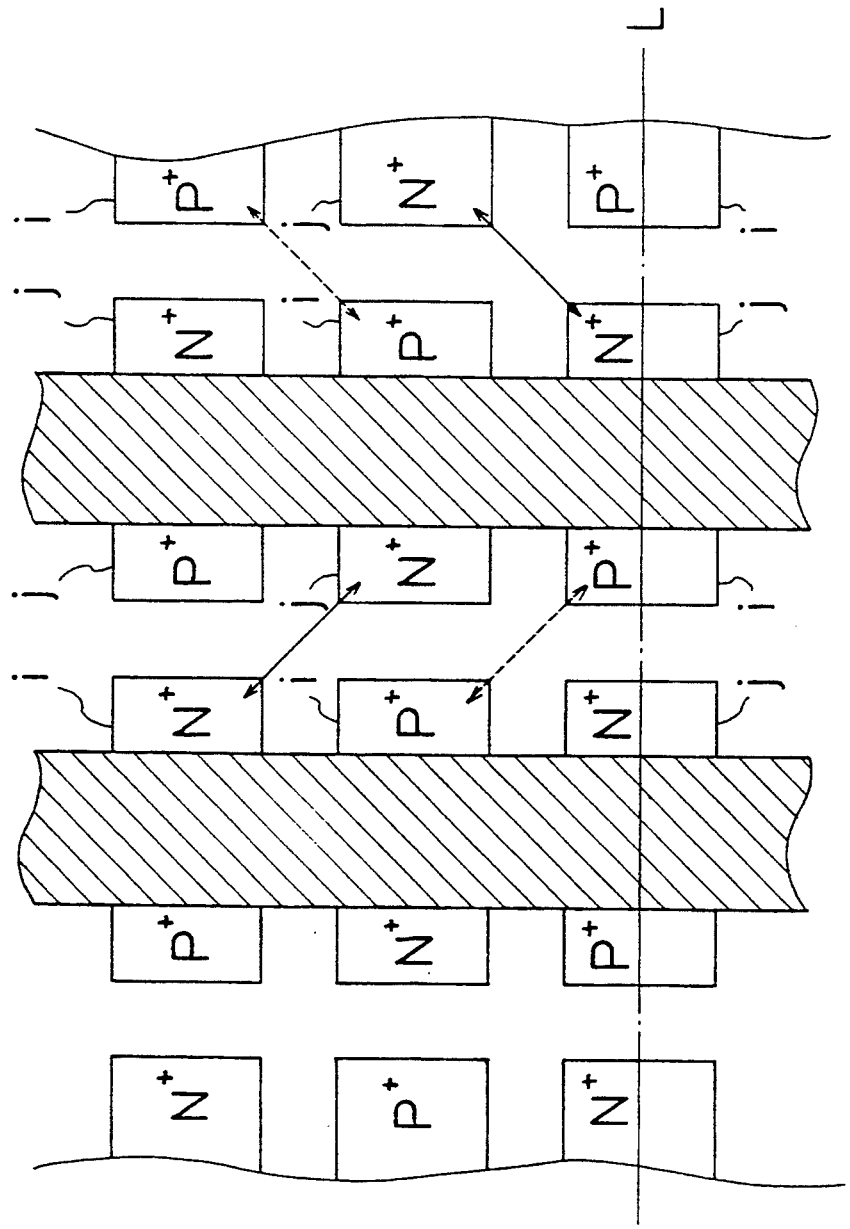
FIG. 32 is a plan view showing interference between regions of a conventional semiconductor device with a drain-and-source structure.
Figure 33A:
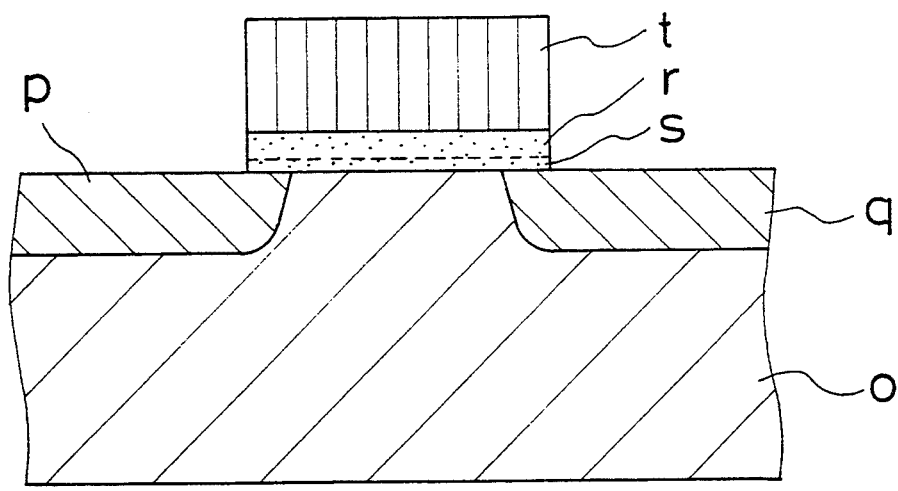
FIG. 33 (a and b) shows a cross-sectional structure of a conventional semiconductor memory device formed by ion implantation to an insulating layer, and current-voltage characteristics.
Figure 33B:
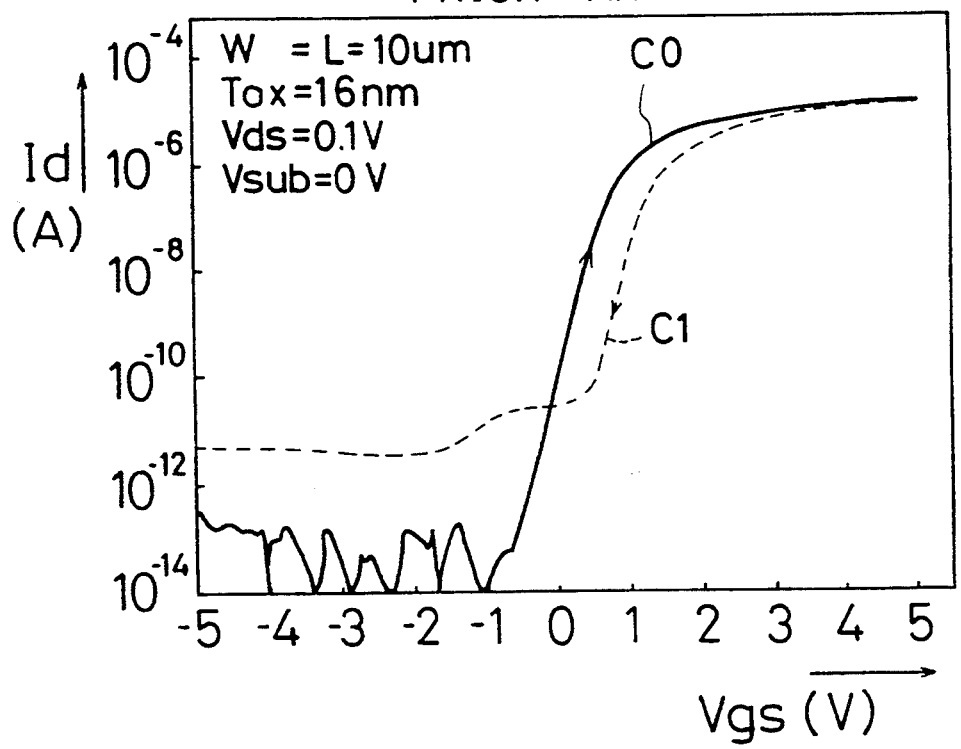

As shown in FIG. 28a, when the voltages of 4 V, 0 V, 5 V and 5 V are applied to the word and bit lines WL0, WL1, BL0 and BL1, respectively, the memory cell W and X are in a state xw in FIG. 28a, which is a "0" WRITE operation. On the other hand, the memory cells Y and Z are in a state yz0 when they are in the state of "0", and are in a state yz1 when they are in a "1" state. This corresponds to a READ operation, and the states of the memory cells X and Y remain unchanged. That is to say, neither READ nor WRITE operation is executed. The current values at Points I and J in FIG. 28b are equal to those at Points I and J in FIG. 28d. A "0" WRITE operation is carried out at Point wx.

In the above "0" WRITE circuit operation, the voltages for the bit lines BL0 and BL1 must be set prior to setting the world lines WL0 and WL1. After the completion of the operation, the voltages set for the word liens must be reset to a former voltage prior to resetting those of the bit lines.

In the foregoing description, only the memory cells on a single word line are shifted to the state of "0" by means of a WRITE operation. It is, of course, possible to shift the memory cells on two or more word lines to the state of "0".

Although the foregoing description has been made by taking an example in which the memory cell array with two word lines and two bit lines is used, another memory cell array with at least one word line and at least one bit line may be available.

2) Circuit Operation Timing Chart

FIG. 29 is a timing chart of "1" WRITE, "0" WRITE and READ operations.

As shown in FIG. 29, in a "1" WRITE circuit operation, two voltage values, −3 V and 0 V are applied to the word lines WLn, whereas two voltage values, 0 V and 5 V are applied to the bit lines BLn. On the other hand, in a "0" WRITE circuit operation, two voltage values, 0 V and 4 V are applied to the word lines WLn, whereas two voltage values, 0 V and 5 V are applied to the bit lines BLn. In a READ circuit operation, two voltage values, −3 V and 0 V are applied to the word lines WLn, whereas two voltage values, 0 V and 2 V are applied to the bit lines BLn.

For a ROM, the set voltages of the word lines WLn and the bit lines BLn may be made up of two voltage values, −3 V and 0 V (for the former) and two voltage values, 0 V and 2 V (for the latter) respectively. For a PROM, the set voltages of the word lines WLn and the bit lines BLn may be made up of two voltage values, −3

V and 0 V (for the former) and three voltage values, 0 V, 2 V and 5 V (for the latter) respectively. In this case, there is an advantage over the first embodiment (the twelfth or thirteenth solving means) that a maximum voltage can be reduced down to 5 V (in the first embodiment, 8 V is required).

For an EEPROM or a RAM, three set voltage values, namely −3 V, 0 V and 8 V are required for the word lines WLn, while three set voltage values, namely 0 V, 2 V and 5 V are required for the bit lines BLn. By this operation, a selective write function, a selective read function and a partial erase function of the write, read and erase means of the thirty-second solving means are constructed respectively. Also, in this case, there is an advantage that a maximum voltage can be reduced.

Therefore, according to the second embodiment, ROMs, PROMs and EEPROMs or nonvolatile RAMs can be configured by simple voltage setting to both the word and bit lines WLn and BLn, which achieves a shorter access time and realizes a large scale integration by simplifying related peripheral circuits. Since the drain region 5 and the source region 4 are the same conductivity type, the manufacturing of, such as, isolation insulators used for avoiding region-to-region interference becomes easier. Accordingly, a large scale integration can be readily realized.

By setting the voltage of each of the terminals according to the following Table 2, it is possible to execute a selective WRITE, selective READ or partial ERASE operation per word line.

TABLE 2

| | WL0 | WL1 | BL0 | BL1 |
|---|---|---|---|---|
| WRITE | −3 | 0 | 5 | 0 |
| READ | −3 | 0 | 2 | 0 |
| ERASE | 8 | 0 | | 0 |

In a READ operation of the second embodiment, pre-charging operation, as in the first embodiment, may be performed.

When an ERASE operation is carried out per word line in the semiconductor memory device including the one without the source region 4 according to the first embodiment, it is possible to perform a selective WRITE, selective READ or partial ERASE operation by setting the voltage of each of the terminals according to the following Table 3. That is, both the word and bit lines WLn and BLn are provided with three values as a set voltage.

TABLE 3

| | WL0 | WL1 | BL0 | BL1 |
|---|---|---|---|---|
| WRITE | −3 | 0 | 5 | 0 |
| READ | −3 | 0 | 2 | 0 |
| ERASE | −9 | 0 | 0 | |

In the first and second embodiments, the gate oxide layer 2 (insulating layer) is formed of $SiO_2$. However, the present invention is not limited to these embodiments, that is to say, the gate oxide layer 2 may be formed of carbide or oxide of various kinds of metal. Also, the semiconductor substrate 1 may be formed of other materials other than Si that is used in the present invention. However, there is an advantage in the use of $SiO_2$, that is to say, $SiO_2$ layers can be made easily by means of thermal oxidation of the surface of the Si substrate. Accordingly, the manufacturing steps become much simpler thereby accomplishing lower costs. Additionally, the quality of layers is improved, the controllability of layer thickness becomes more manageable, and it is easy to obtain clean surfaces. Furthermore, the insulating layer characteristics become favorable. Further, there is another advantage that the Si substrate has a strong affinity for Si, so that possible stress to be applied to the Si substrate is reduced to a relatively low level. Since the band barrier height between the Si substrate and the $SiO_2$ layer is about 3.5 eV, the operating voltage at TTL levels can be realized.

In the foregoing embodiments, the gate oxide layer 2 has a single layer structure, that is to say, which is formed by a single $Si_2$ layer only. However, the present invention is not limited to such embodiments. For instance, it is possible to grow a second insulating layer of $Si_3N_4$ over the $SiO_2$ layer thereby forming a multilayer structure of two layers. In this case, by employing a layer of $Si_3N_4$ having a high dielectric constant, the layer thickness can be made thicker. As a result, the electrical pressure-resistance is improved. Further, since electric charges are apt to be trapped at the interface between the $SiO_2$ layer and the $Si_3N_4$ layer, the trapping efficiency during WRITE operation is improved, and READ operation is readily executed as a result of the expansion of a read current between "0" and "1" states. Because of such an expansion, it is possible to miniaturize memory cells, to compress peripheral current amplifier circuits, and to achieve a large scale integration.

Further, it is also possible to form a $Si_3N_4$ layer and a $SiO_2$ layer on the $SiO_2$ layer (a so-called ONO layer) thereby forming a multilayer structure of three layers. In addition to the above advantages, the quality of layers can be improved by avoiding such defects as pinholes in the $Si_3N_4$ layer. Additionally, for the junction to Si, $SiO_2$ causes less stress to it (Si) than $Si_3N_4$ does, so that stress being created at the interface between the $SiO_2$ layer and the gate electrode 3, usually of polysilicon, is relaxed. Also, it is possible to employ a multilayer structure of four or more layers to the gate oxide layer.

It is possible to provide a floating gate electrode of such materials as polysilicon in the gate oxide layer 2 to trap charges in the floating gate electrode. In this case, since charges are trapped in the floating gate electrode that is conductive, it is possible to expand the current difference between "0" and "1" states. Therefore, the foregoing advantages are obtained. There is a further advantage that the durability of insulating layers is more improved in comparison to a memory cell structure where charges are trapped in and derrapped from the insulating layer.

INDUSTRIAL APPLICABILITY

The present invention is available for such semiconductor memory devices as ROMs, PROMs, EEPROMs and RAMs, and more particularly it is available for integrated semiconductor memory devices.

What is claimed is:

1. A semiconductor memory device comprising at least one memory cell which is formed on a semiconductor substrate of a first conductivity type and comprises a drain region of a second conductivity type which is formed selectively on a surface location of the semiconductor substrate, an insulating layer which is formed on the semiconductor substrate, overlaying, at least partly, an edge of the drain region, and a gate electrode which is formed on the insulating layer, wherein:

an energy gap between the conduction band and the valence band of a semiconductor section including the drain region and the semiconductor substrate is preset to a value not more than an energy gap value corresponding to a first set voltage difference between the drain region and the gate electrode, and either an energy gap between the valence band of the insulating layer and the valence band of the semiconductor section or an energy gap between the conduction band of the insulating layer and the conduction band of the semiconductor section, at the interface between the semiconductor section and the insulating layer, is preset to an energy gap value corresponding to a second set voltage difference between the drain region and the semiconductor substrate which varies, depending on the voltage of the gate electrode, the memory cell is capable of storing information in a nonvolatile manner "1" or "0", in which "1" means a state of holding charges in the insulating layer and "0" means a state of not-holding charges therein, at least one memory cell is previously in the state of "1", and erase means is provided, which imposes between both faces of the insulating layer of the memory cell which holds charges and is in the state of "1" a high electric field to generate a Fowler-Nordheim current to implant charges, which have a reverse polarity with respect to the charges trapped, into the insulating layer thereby shifting the memory cell into the state of "0".

2. A semiconductor memory device comprising at least one memory cell which is formed on a semiconductor substrate of a first conductivity type and comprises a drain region of a second conductivity type which is formed selectively on a surface location of the semiconductor substrate, an insulating layer which is formed on the semiconductor substrate, overlaying, at least partly, an edge of the drain region, and a gate electrode which is formed on the insulating layer, wherein:

an energy gap between the conduction band and the valence band of a semiconductor section including the drain region and the semiconductor substrate is preset to a value not more than an energy gap value corresponding to a first set voltage difference between the drain region and the gate electrode, and either an energy gap between the valence band of the insulating layer and the valence band of the semiconductor section or an energy gap between the semiconductor band of the insulating layer and the conduction band of the semiconductor section and the insulating layer, is reset to an energy gap value corresponding to a second set voltage difference between the drain region and the semiconductor substrate which varies, depending on the voltage of the gate electrode, the memory cell is capable of storing information in a nonvolatile manner "1" or "0", in which "1" means a state of holding charges in the insulating layer and "0" means a state of not-holding charges therein, read means is provided, which applies between the drain region and the gate electrode a voltage not less than the first set voltage difference while applying between the drain region and the semiconductor substrate a voltage lower than the second set voltage difference to read the contents of a memory by sensing a gate induced drain leakage current value, write means is provided, which applies between the drain region and the gate electrode a voltage not less than the first set voltage difference while applying between the drain region and the semiconductor substrate a voltage not less than the second set voltage difference to generate a gate induced drain leakage current thereby causing charges to be trapped in the insulating layer, and erase means is provided, which erases the charge trapped in the insulated layer of the memory cell which is in the state of "1" thereby shifting the memory cell to the state of "0".

3. The semiconductor memory device of claim 2, wherein:

each memory cell is previously in the state of "1".

4. The semiconductor memory device of claim 2, wherein:

at least four memory cells are provided, at least two word lines and at least two bit lines are provided in which each word line is connected to the gate electrodes of at least two of the memory cells while each bit line is connected to the drain regions of at least two of the memory cells, and the write means and the read means carry out a selective write operation and a selective read operation respectively, wherein a selective word line voltage Vkcw and a nonselective word line voltage Vknw for a write operation; a selective word line voltage Vycw and a non-selective word line voltage Vynw for a read operation; a selective bit line voltage Vkcb and a non-selective bit line voltage Vknb for a write operation; and a selective bit line voltage Vycb and a non-selective bit line voltage Vynb for a read operation are set either according to Vkcw=Vycw<Vknw=Vynw and Vknb=Vynb<Vycb<Vkcb for a p-type substrate or according to Vkcw=Vycw>Vknw=Vynw and Vknb=Vynb>Vycb>Vkcb for an n-type substrate, and the set voltages of the word lines comprise two values while the set voltages of the bit lines comprise three values.

5. The semiconductor memory device of claim 2, wherein:

at least four memory cells are provided, at least two word lines and at least two bit lines are provided in which each word line is connected to the gate electrodes of at least two of the memory cells while each bit line is connected to the drain regions of at least two of the memory cells, and the write means and the read means carry out a selective write operation and a selective read operation respectively, wherein a selective word line voltage Vkcw and a non-selective word line voltage Vknw for a write operation; a selective word line voltage Vycw and a non-selective word line voltage Vynw for a read operation; a selective bit line voltage Vkcb and a non-selective bit line voltage Vknb for a write operation; and a selective bit line voltage Vycb and a non-selective bit line voltage Vynb for a read operation are set either according to Vkcw<Vknw=Vycw<Vynw and Vknb=Vynb<Vkcb=Vycb for a p-type substrate or according to Vkcw>Vknw=Vycw>Vynw and Vknb=Vynb>Vkcb=Vycb for an n-type substrate, and the set voltages of the word lines comprise three values while the set voltages of the bit lines comprise two values.

6. The semiconductor memory device of either claim 1 or claim 2,
wherein:
at least four memory cells are provided,
at least two word lines and at least two bit lines are provided in which each word line is connected to the gate electrodes of at least two of the memory cells while each bit line is connected to the drain regions of at least two of the memory cells, and
the erase means selectively erases the contents of a memory wherein a selective word line voltage Vscw, a non-selective word line voltage Vsnw, a selective bit line voltage Vscb and a non-selective bit line voltage Vsnb are set either according to Vscw>Vsnw and Vsnb>Vscb for a p-type substrate or according to Vscw<Vsnw and Vsnb<Vscb for an n-type substrate, and the set voltages of the word lines comprise two values while the set voltages of the bit lines comprise two values.

7. The semiconductor memory device of either claim 2.
wherein:
at least four memory cells are provided,
at least two word lines and at least two bit lines are provided in which each word line is connected to the gate electrodes of at least two of the memory cells while each bit line is connected to the drain regions of at least two of the memory cells, and
the write means, the read means and the erase means carry out a selective write operation, a selective read operation and a selective erase operation respectively, wherein a selective word line voltage Vkcw and a non-selective word line voltage Vknw for a write operation; a selective word line voltage Vycw and a non-selective word line voltage Vynw for a read operation; a selective word line voltage Vscw and a non-selective word line voltage Vsnw for an erase operation; a selective bit line voltage Vkcb and a non-selective bit line voltage Vknb for a write operation; a selective bit line voltage Vycb and a non-selective bit line voltage Vynb for a read operation; and a selective bit line voltage Vscb and a non-selective bit line voltage Vsnb for an erase operation are set either according to Vkcw=Vycw<Vknw=Vynw=Vsnw<Vscw and Vknb=Vynb=Vscb<Vycb Vkcb=Vsnb for a p-type substrate or according to Vkcw=Vycw>Vknw=Vynw=Vsnw>Vscw and Vknb=Vynb=Vscb>Vycb>Vkcb=Vsnb for an n-type substrate, and the set voltages of the word lines comprise three values while the set voltages of the bit lines comprise three values.

8. The semiconductor memory device of claim 2,
wherein:
at least four memory cells are provided,
at least two word lines and at least two bit lines are provided in which each word line is connected to the gate electrodes of at least two of the memory cells while each bit line is connected to the drain regions of at least two of the memory cells, and
the write means, the read means and the erase means carry out a selective write operation, a selective read operation and a selective erase operation respectively wherein a selective word line voltage Vkcw and a non-selective word line voltage Vknw for a write operation; a selective word line voltage Vycw and a non-selective word line voltage Vynw for a read operation; a selective word line voltage Vscw and a non-selective word line voltage Vsnw for an erase operation; a selective bit line voltage Vkcb and a non-selective bit line voltage Vknb for a write operation; a selective bit line voltage Vycb and a non-selective bit line voltage Vynb for a read operation; and a selective bit line voltage Vscb and a non-selective bit line voltage Vsnb for an erase operation are set either according to Vkcw<Vknw=Vycw=Vsnw<Vynw<Vscw and Vknb=Vynb=Vscb<Vkcb=Vycb=Vsnb for a p-type substrate or according to Vkcw>Vknw=Vycw=Vsnw>Vynw>Vscw and Vknb=Vynb=Vscb>Vkcb=Vycb=Vsnb for an n-type substrate, and the set voltages of the word lines comprise four values while the set voltages of the bit lines comprise two values.

9. A semiconductor memory device comprising at least one memory cell which is formed on a semiconductor substrate of a first conductivity type and comprises a drain region of a second conductivity type which is selectively formed on a surface location of the semiconductor substrate, a source region of a second conductivity type which is selectively formed on a surface location of the semiconductor substrate, being spaced a given distance away from the drain region, an insulating layer which is formed on the semiconductor substrate, overlaying, at least partly, an edge of the drain region and extending to an edge of the source region, and a gate electrode which is formed on the insulating layer, wherein:
an energy gap between the conduction band and the valence band of a semiconductor section including the drain region and the semiconductor substrate is preset to a value not more than an energy gap value corresponding to a first set voltage difference between the drain region and the gate electrode, and either an energy gap between the valence band of the insulating layer and the valence band of the semiconductor section or an energy gap between the conduction band of the insulating layer and the conduction band of the semiconductor section, at the interface between the semiconductor section and the insulating layer, is preset to an energy gap value corresponding to a second set voltage difference between the drain region and the semiconductor substrate which varies, depending on the voltage of the gate electrode,
the memory cell is capable of storing information in a nonvolatile manner "1" or "0", in which "1" means a state of holding charges in the insulating layer and "0" means a state of not-holding charges therein,
at least one memory cell is previously in the state of "1", and
erase means is provided, which erases the charge trapped in the insulating layer of the memory cell which is in the state of "1" thereby shifting the memory cell into the state of "0".

10. The semiconductor memory device of claim 9
wherein:
write means is provided, which applies between the drain region and the gate electrode a voltage not less than the first set voltage difference while applying between the drain region and the semiconductor substrate a voltage not less than the second set voltage difference to generate a gate induced drain leakage current thereby causing charges to be trapped in the insulating layer that is then shifted to the state of "1", and read means is provided, which applies a given voltage to the gate electrode while applying between the drain region and the semiconductor substrate a voltage lower than the second set voltage difference to read the contents of a memory by sensing a gate induced drain leakage current value.

11. The semiconductor memory device of claim 9, wherein:

erase means is provided, which imposes between both faces of the insulating layer of the memory cell which holds charges and is in the state of "1" a high electric field to generate a Fowler-Nordheim current to implant charges, which have a reverse polarity with respect to the charges trapped, into the insulating layer to shift the memory cell to the state of "0".

12. The semiconductor memory device of claim 9, wherein:

erase means is provided, which applies a given voltage between the drain and source regions, with the voltage of the gate electrode fixed, to generate a drain to source current, resultant hot carriers having a reverse polarity with respect to the charges trapped being implanted into the insulating layer to shift the memory cell to the state of "0".

13. The semiconductor memory device of claim 9, 11 or 12,
wherein:
each memory cell is previously in the state of "1".

14. The semiconductor memory device of claim 10, wherein:

at least four memory cells are provided, at least two word lines and at least two bit lines are provided in which each word line is connected to the gate electrodes of at least two of the memory cells while each bit line is connected to the drain regions of at least two of the memory cells, and the write means and the read means carry out a selective write operation and a selective read operation respectively wherein a selective word line voltage Vkcw and a non-selective word line voltage Vknw for a write operation; a selective word line voltage Vycw and a non-selective word line voltage Vynw for a read operation; a selective bit line voltage Vkcb and a non-selective bit line voltage Vknb for a write operation; and a selective bit line voltage Vycb and a non-selective bit line voltage Vynb for a read operation are set either according to Vkcw=Vycw<Vynw=Vynw and Vknb=Vynb<Vycb<Vkcb for a p-type substrate or according to Vkcw=Vycw>Vknw=Vynw and Vknb=Vynb>Vycb>Vkcb for an n-type substrate, and the set voltages of the word lines comprise two values while the set voltages of the bit lines comprise three values.

15. The semiconductor memory device of claim 10, wherein:

at least four memory cells are provided, at least two word lines and at least two bit lines are provided in which each word line is connected to the gate electrodes of at least two of the memory cells while each bit line is connected to the drain regions of at least two of the memory cells, and the write means, the read means and the erase means carry out a selective write operation, a selective read operation and an erase operation for deleting the information of a memory in all of the memory sells sharing a common word line at the same time, respectively wherein a selective word line voltage Vkcw and a non-selective word line voltage Vknw for a write operation; a selective word line voltage Vycw and a non-selective word line voltage Vynw for a read operation; a selective word line voltage Vscw and a non-selective word line voltage Vsnw for an erase operation; a selective bit line voltage Vkcb and a non-selective bit line voltage Vknb for a write operation; a selective bit line voltage Vycb and a non-selective bit line voltage Vynb for a read operation; and a selective bit line voltage Vscb and a non-selective bit line voltage Vsnb for an erase operation are set either according to Vkcw=Vycw<Vknw=Vynw=Vsnw<Vscw and Vknb=Vynb=Vscb=Vsnb<Vycb<Vkcb for a p-type substrate or according to Vkcw=Vycw>Vknw=Vynw=Vsnw>Vscw and Vknb=Vynb=Vscb=Vsnb>Vycb>Vkcb for an n-type substrate, and the set voltages of the word lines comprise three values while the set voltages of the bit lines comprise three values.

16. The semiconductor memory device of claim 10, wherein:

at least four memory cells are provided, at least two word lines and at least two bit lines are provided in which each word line is connected to the gate electrodes of at least two of the memory cells while each bit line is connected to the drain regions of at least two of the memory cells, and the write means, the read means and the erase means carry out a selective write operation, a selective read operation and an erase operation for deleting the contents of a memory in the memory sells connected to each word line, respectively wherein a selective word line voltage Vkcw and a non-selective word line voltage Vknw for a write operation; a selective word line voltage Vycw and a non-selective word line voltage Vynw for a read operation; a selective word line voltage Vscw and a non-selective word line voltage Vsnw for an erase operation; a selective bit line voltage Vkcb and a non-selective bit line voltage Vknb for a write operation; a selective bit line voltage Vycb and a non-selective bit line voltage Vynb for a read operation; and a selective bit line voltage Vscb and a non-selective bit line voltage Vsnb for an erase operation are set either according to Vkcw-Vycw<Vknw=Vsnw=Vynw<Vscw and Vknb=Vynb<Vycb<Vkcb=Vscb=Vsnb for a p-type substrate or according to Vkcw=Vycw>Vknw=Vsnw=Vynw>Vscw and Vknb=Vynb>Vycb>Vkcb=Vscb=Vsnb for an n-type substrate, and the set voltages of the word lines comprise three values while the set voltages of the bit lines comprise three values.

17. The semiconductor memory device of claim 9, wherein a floating gate electrode is formed in the insulating layer for trapping charges therein.

* * * * *